(12) United States Patent
Mozak et al.

(10) Patent No.: US 12,093,195 B2
(45) Date of Patent: *Sep. 17, 2024

(54) TECHNIQUES FOR COMMAND BUS TRAINING TO A MEMORY DEVICE

(71) Applicant: Intel Corporation, Santa Clara, CA (US)

(72) Inventors: Christopher P. Mozak, Portland, OR (US); Steven T. Taylor, Beaverton, OR (US); Alvin Shing Chye Goh, Bayan Lepas (MY)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/134,920

(22) Filed: Apr. 14, 2023

(65) Prior Publication Data

US 2023/0297523 A1 Sep. 21, 2023

Related U.S. Application Data

(63) Continuation of application No. 16/709,798, filed on Dec. 10, 2019, now Pat. No. 11,675,716.

(51) Int. Cl.
| | |
|---|---|
| *G06F 12/00* | (2006.01) |
| *G06F 9/30* | (2018.01) |
| *G06F 13/16* | (2006.01) |
| *G06F 13/42* | (2006.01) |
| *G06F 18/214* | (2023.01) |
| *G11C 7/10* | (2006.01) |

(Continued)

(52) U.S. Cl.
CPC ...... *G06F 13/1689* (2013.01); *G06F 9/30029* (2013.01); *G06F 13/4243* (2013.01); *G06F 18/214* (2023.01); *G11C 7/1045* (2013.01); *G11C 7/1048* (2013.01); *G11C 7/222* (2013.01); *H03M 13/09* (2013.01)

(58) Field of Classification Search
CPC ............ G06F 13/1689; G06F 9/30029; G06F 13/4243; G06F 18/214; G06F 13/1694; G11C 7/1045; G11C 7/1048; G11C 7/222; G11C 2029/0409; G11C 2029/0411; G11C 7/1066; G11C 7/1093; G11C 29/52; G11C 29/74; G11C 2207/2254; H03M 13/09

See application file for complete search history.

(56) References Cited

U.S. PATENT DOCUMENTS

| | | |
|---|---|---|
| 9,026,725 B2 | 5/2015 | Kostinsky et al. |
| 9,722,663 B2 | 8/2017 | Kostinsky et al. |

(Continued)

FOREIGN PATENT DOCUMENTS

EP 3200189 A1 8/2017

OTHER PUBLICATIONS

Extended European Search Report for Patent Application No. 23198384.2, Mailed Nov. 30, 2023, 7 pages.

(Continued)

*Primary Examiner* — Arvind Talukdar
(74) *Attorney, Agent, or Firm* — Compass IP Law PC

(57) ABSTRACT

Techniques for command bus training to a memory device includes triggering a memory device to enter a first or a second command bus training mode, outputting a command/address (CA) pattern via a command bus and compressing a sampled CA pattern returned from the memory device based on whether the memory device was triggered to be in the first or the second command bus training mode.

20 Claims, 11 Drawing Sheets

SYSTEM 300

(51) Int. Cl.
    *G11C 7/22*         (2006.01)
    *H03M 13/09*     (2006.01)

(56) References Cited

U.S. PATENT DOCUMENTS

| | | |
|---|---|---|
| 10,416,912 B2 | 9/2019 | Morris et al. |
| 2009/0019323 A1 | 1/2009 | Porterfield |
| 2014/0189224 A1 | 7/2014 | Kostinsky et al. |
| 2018/0181504 A1 | 6/2018 | Morris et al. |

OTHER PUBLICATIONS

European First Office Action for Patent Application No. 20194486.5, Mailed Apr. 22, 2022, 4 pages.
Extended European Search Report for Patent Application No. 20194486.5, Mailed Feb. 16, 2021, 9 pages.
Jedec, "DDR5 Full Spec Proposal", Draft Rev 0.1, Committee Letter Ballot, 2011, 321 pages.
Notice of Allowance for U.S. Appl. No. 16/709,798, Mailed Jan. 25, 2023, 10 pages.

500

| | PARAMETER | SYMBOL | MIN/MAX | Time | UNIT |
|---|---|---|---|---|---|
| 502 | Static WCK period (CBT entry to WCK toggling start) | tCBTWCKPRE_static | Max. | (20ns, 2nCK) | ns |
| 504 | Set-up margin between DQ7 and WCK | tWCK2DQ7H | Max. | (5ns, 12nWCK) | ns |
| 505 | Hold margin between DQ7 and WCK | tDQ7HWCK | Max. | (5ns, 12nWCK) | ns |
| 508 | Clock and Command Valid after DQ7 HIGH | tDQ7HCK | Max. | (5ns, 3nCK) | ns |
| 510 | Valid Clock Requirement before CS High | tCHPRECS | Max. | 2tCK + tXP (tXP = (7.5ns, 3nCK)) | ns |
| 512 | Valid Clock Requirement after CS High | tCKPSTCS | Max. | (7.5ns, 3nCK) | ns |
| 514 | Delay time from DQ[7] High to CA Bus Training | tCAENT | Min. | 250 | ns |
| 516 | Asynchronous Data Read | tADR | Max. | 20 | ns |
| 518 | CA Bus Training Command to CA Bus Training Command delay | tCACD | Min. | RU(tADR/tCK) | tCK |
| 520 | CK and Command Valid before DQ7 Low | tCKDQ7L | Max. | (5ns, 3nCK) | ns |
| 522 | DQ7 Low to static WCK | tDQ7LWCK | Max. | (5ns, 12nWCK) | na |

| | SYMBOL | DESCRIPTION | MIN | MAX | UNIT |
|---|---|---|---|---|---|
| 702 | tCATM_Entry | Registration of CATM entry command to start of training samples time | 20 | - | ns |
| 704 | tCATM_Exit | Registration of CATM exit CS-n assertion to end of training mode. This is when DQ is no longer driven by the DRAM | - | 14 | ns |
| 706 | tCATM_Exit_Delay | Registration of CATM exit to next valid command delay | 20 | - | ns |
| 708 | tCATM_Valid | Time for sample evaluation to output on DQ bus | - | 20 | ns |
| 710 | tCATM_DQ-Window | Time output is available on DQ Bus | 2 | - | nCK |
| 712 | tCATM_CS_Exit | CS_n assertion duration to exit CATM | 2 | 8 | nCK |

*FIG. 7*

TECHNIQUES FOR COMMAND BUS TRAINING TO A MEMORY DEVICE

CROSS-REFERENCE TO RELATED APPLICATIONS

This application is a continuation of U.S. patent application Ser. No. 16/709,798, filed Dec. 10, 2019. The entire specification of which is hereby incorporated herein by reference in its entirety.

TECHNICAL FIELD

Descriptions are generally related to techniques for command bus training to a memory device.

BACKGROUND

Standardization of memory subsystem processes may allow for interoperability among different device manufacturers. Standardization allows for building devices with different architectural designs and different processing technologies that function according to specified guidelines. Memory devices receive commands from memory controllers over command buses, which are traditionally trained to ensure that the signaling between the devices meets the expected standards. Training can refer to iterative testing of different I/O (input/output) interface parameters to determine settings that result in best accuracy of signaling on the signal lines. A common term for signal accuracy is finding a middle or center of a signal eye. Memory technologies need to train a command bus timing and voltage sampling point to be in a middle or center of a signal eye for optimal performance.

BRIEF DESCRIPTION OF THE DRAWINGS

FIG. 5 illustrates an example first table.
FIG. 7 illustrates an example second table.

DETAILED DESCRIPTION

Figure 1:
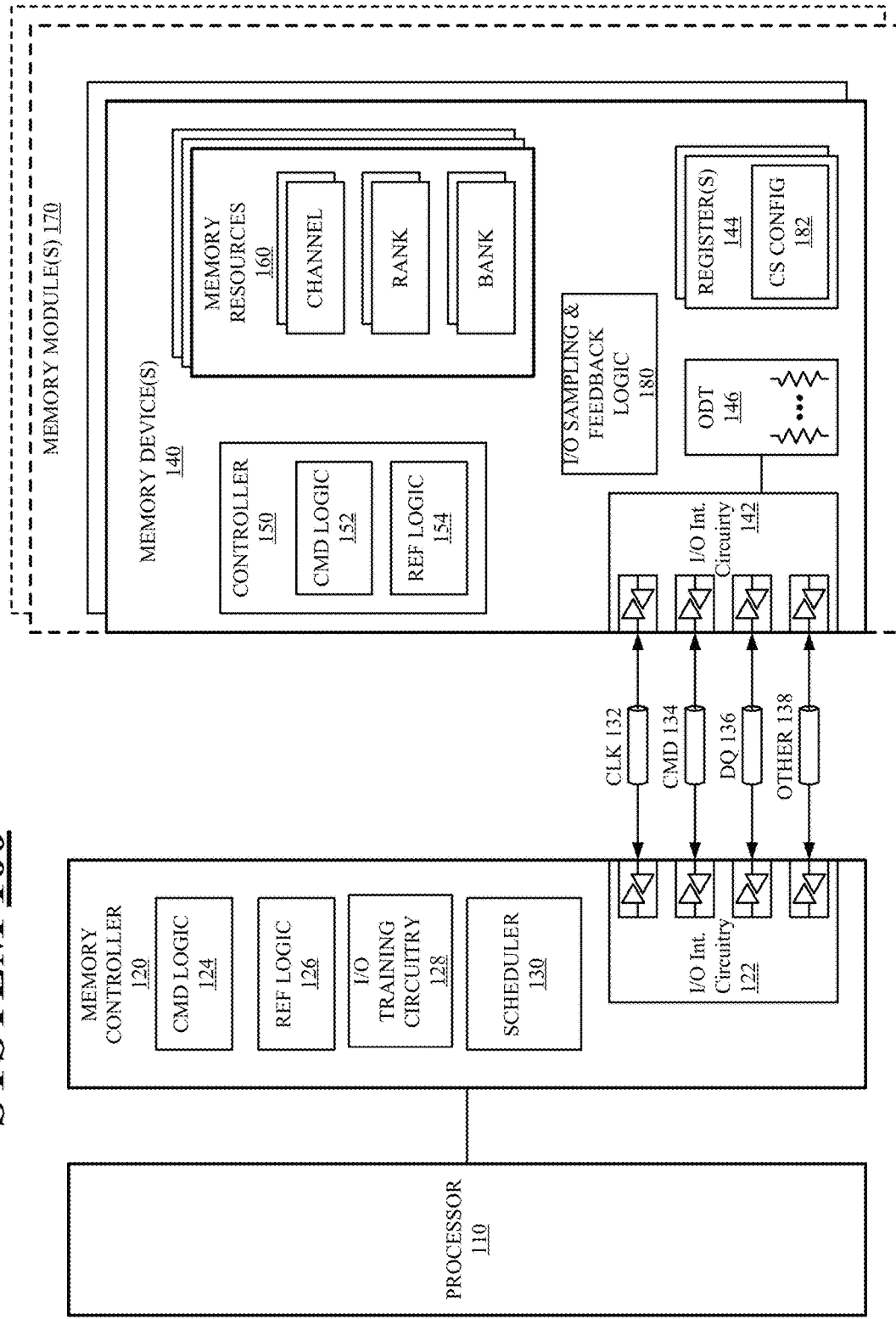
FIG. 1 illustrates an example system.

Variations in how signals are sent and received between a memory controller and one or more memory devices may be caused by differences in memory device designs as well as decreasing memory device geometries, shrinking package sizes, increasing channel bandwidth, and increasing signaling frequencies. Thus, a significant variation in memory channel layouts makes it unlikely for memory device suppliers to guarantee that a memory device will operate in a default state without command bus training. Command bus training is particularly complex since it's a chicken and egg problem where the command bus may be the only way to communication with a memory device that may have no sideband communication channel. Yet that same command bus requires proper centering. It is also difficult to attempt to complete command bus training outside of standardized training modes (e.g., to address complicated cross-talk or interference situations) since errors on the command bus may cause a memory device to hang or lock up. A hung or locked up memory device may lead to a long and expensive reset flow or process.

As described herein, reference to memory devices can apply to different memory types. Memory devices may refer to volatile memory technologies. Volatile memory is memory whose state (and therefore the data stored on it) is indeterminate if power is interrupted to the device. Non-volatile memory refers to memory whose state is determinate even if power is interrupted to the device. Dynamic volatile memory requires refreshing the data stored in the device to maintain state. One example of dynamic volatile memory includes dynamic random access memory (DRAM), or some variant such as synchronous DRAM (SDRAM). A memory subsystem as described herein may be compatible with a number of memory technologies or standards, such as DDR3 (double data rate version 3, JESD79-3, originally published by JEDEC (Joint Electronic Device Engineering Council) on Jun. 27, 2007), DDR4 (DDR version 4, JESD79-4, originally published in September 2012 by JEDEC), LPDDR3 (low power DDR version 3, JESD209-3B, originally published in August 2013 by JEDEC), LPDDR4 (low power DDR version 4, JESD209-4, originally published by JEDEC in August 2014), WIO2 (Wide I/O 2 (WideIO2), JESD229-2, originally published by JEDEC in August 2014), HBM (high bandwidth memory DRAM, JESD235, originally published by JEDEC in October 2013), LPDDR5 (originally published by JEDEC in February 2019), HBM2 ((HBM version 2), originally published by JEDEC in December 2018), DDR5 (DDR version 5, currently in discussion by JEDEC), or others or combinations of memory technologies, and technologies based on derivatives or extensions of such specifications.

DRAM memory devices designed to operate in accordance with LPDDR4 or LPDDR5 standards or specifications may have command bus training (CBT) modes that sample command/address (CA) values received via a command bus when a chip select (CS) signal is toggled and returns the sampled CA values on a data bus to a memory controller. The receiving memory controller may use this feedback to adjust a voltage reference for the command bus (VrefCA) (e.g., LPDDR5 mode register (MR) MR12.OP[6:0]). The receiving memory controller may also use this feedback to adjust relative timing between the command bus and a clock (CLK), usually with phase interpolator circuitry, or may adjust advanced signaling techniques associated with higher command bus frequencies such as transmit or receiver equalization techniques. The CBT mode allows for training of LPDDR4 or LPDDR5 command buses, but it is a slow process that typically needs to run through firmware/software. For example, these LPDDR4/LPDDR5 CBT modes may require firmware/software to program a CA pattern, send the CA pattern to the DRAM via the command bus, read the sampled values returned on the data bus and have the firmware/software check for correctness or errors. Each of these steps are coordinated by the firmware such that, in some examples, command bus training may only take 1 sample every few microseconds. A rate of 1 sample every few microseconds may greatly limit how many CA patterns can be tested in an acceptable period of time. Also, the limited rate of sampling may negatively impact command bus training quality given that normal operation of LPDDR4 or LPDDR5 DRAM memory devices can present opportunities to gather/observe multiple samples per nanosecond. Thus, thousands of potential sampling points may be missed for observing correctness or errors of CA patterns when LPDDR4/LPDDR5 CBT modes are run through firmware/software at a memory controller.

DRAM memory devices designed to operate according to the proposed DDR5 specification support a command bus training mode called command address training mode (CATM). CATM samples CA values when CS toggles and returns results on a data bus for these types of DDR5 memory devices. However, instead of returning actual sampled CA values, DDR5 memory devices include internal circuitry to return just a parity of the sampled CA value. CATM significantly simplifies error checking of CA patterns since logic at the memory controller just needs to check if the data bus has been driven high (parity value indicating errors) or low (parity value indicating no errors) by the memory device. As a result, the logic at the memory controller arranged for command bus training of DDR5 memory devices no longer needs to compare CA patterns transmitted over the command bus with memory device sampled CA patterns returned via the data bus.

Simplified parity checks by logic at a DDR5 memory device for CA patterns during CATM eliminates most of the coordination work firmware is required to do compared to LPDDR4 and LPDDR5 memory devices during their respective command bus training modes. However, LPDDR4 and LPDDR5 memory devices lack the internal circuitry and logic to implement a command bus training mode similar to CATM. Therefore, a need exists for techniques to minimize coordination work of firmware at memory controllers implementing command bus training modes on LPDDR4 or LPDDR5 memory devices to shorten an amount of time to train a command bus and increase quality of command bus training.

FIG. 1 illustrates an example system 100. In some examples, as shown in FIG. 1, system 100 includes a processor and elements of a memory subsystem in a computing device. Processor 110 represents a processing unit of a computing platform that may execute an operating system (OS) and applications, which can collectively be referred to as the host or the user of the memory subsystem. The OS and applications execute operations that result in memory accesses. Processor 110 can include one or more separate processors. Each separate processor may include a single processing unit, a multicore processing unit, or a combination. The processing unit may be a primary processor such as a central processing unit (CPU), a peripheral processor such as a graphics processing unit (GPU), or a combination. Memory accesses may also be initiated by devices such as a network controller or hard disk controller. Such devices may be integrated with the processor in some systems or attached to the processer via a bus (e.g., a PCI express bus), or a combination. System 100 may be implemented as a system on a chip (SOC) or may be implemented with standalone components.

Reference to memory devices may apply to different memory types. Memory devices often refers to volatile memory technologies such as DRAM. In addition to, or alternatively to, volatile memory, in some examples, reference to memory devices can refer to a nonvolatile memory device whose state is determinate even if power is interrupted to the device. In one example, the nonvolatile memory device is a block addressable memory device, such as NAND or NOR technologies. A memory device may also include byte or block addressable types of non-volatile memory having a 3-dimensional (3-D) cross-point memory structure that includes, but is not limited to, chalcogenide phase change material (e.g., chalcogenide glass) hereinafter referred to as "3-D cross-point memory". Non-volatile types of memory may also include other types of byte or block addressable non-volatile memory such as, but not limited to, multi-threshold level NAND flash memory, NOR flash memory, single or multi-level phase change memory (PCM), resistive memory, nanowire memory, ferroelectric transistor random access memory (FeTRAM), anti-ferroelectric memory, resistive memory including a metal oxide base, an oxygen vacancy base and a conductive bridge random access memory (CB-RAM), a spintronic magnetic junction memory, a magnetic tunneling junction (MTJ) memory, a domain wall (DW) and spin orbit transfer (SOT) memory, a thyristor based memory, a magnetoresistive random access memory (MRAM) that incorporates memristor technology, spin transfer torque MRAM (STT-MRAM), or a combination of any of the above.

Descriptions herein referring to a "RAM" or "RAM device" can apply to any memory device that allows random access, whether volatile or nonvolatile. Descriptions referring to a "DRAM", "SDRAM, "DRAM device" or "SDRAM device" may refer to a volatile random access memory device. The memory device, SDRAM or DRAM may refer to the die itself, to a packaged memory product that includes one or more dies, or both. In some examples, a system with volatile memory that needs to be refreshed may also include at least some nonvolatile memory.

Memory controller 120, as shown in FIG. 1, may represent one or more memory controller circuits or devices for system 100. Also, memory controller 120 may include logic and/or features that generate memory access commands in response to the execution of operations by processor 110. In some examples, memory controller 120 may access one or more memory device(s) 140. For these examples, memory device(s) 140 may be SDRAM devices in accordance with any referred to above. Memory device(s) 140 may be organized and managed through different channels, where these channels may couple in parallel to multiple memory devices via buses and signal lines. Each channel may be independently operable. Thus, separate channels may be independently accessed and controlled, and the timing, data transfer, command and address exchanges, and other operations may be separate for each channel. Coupling may refer to an electrical coupling, communicative coupling, physical coupling, or a combination of these. Physical coupling may include direct contact. Electrical coupling, for example, includes an interface or interconnection that allows electrical flow between components, or allows signaling between components, or both. Communicative coupling, for example, includes connections, including wired or wireless, that enable components to exchange data.

According to some examples, settings for each channel are controlled by separate mode registers or other register settings. For these examples, memory controller 120 may manages a separate memory channel, although system 100 may be configured to have multiple channels managed by a single memory controller, or to have multiple memory controllers on a single channel. In one example, memory controller 120 is part of processor 110, such as logic and/or features of memory controller 120 are implemented on the same die or implemented in the same package space as processor 110.

Memory controller 120 includes I/O interface circuitry 122 to couple to a memory bus, such as a memory channel as referred to above. I/O interface circuitry 122 (as well as I/O interface circuitry 142 of memory device(s) 140) may include pins, pads, connectors, signal lines, traces, or wires, or other hardware to connect the devices, or a combination of these. I/O interface circuitry 122 may include a hardware interface. As shown in FIG. 1, I/O interface circuitry 122 includes at least drivers/transceivers for signal lines. Commonly, wires within an integrated circuit interface couple with a pad, pin, or connector to interface signal lines or traces or other wires between devices. I/O interface circuitry 122 can include drivers, receivers, transceivers, or termination, or other circuitry or combinations of circuitry to exchange signals on the signal lines between memory controller 120 and memory device(s) 140. The exchange of signals includes at least one of transmit or receive. While shown as coupling I/O interface circuitry 122 from memory controller 120 to I/O interface circuitry 142 of memory device(s) 140, it will be understood that in an implementation of system 100 where groups of memory device(s) 140 are accessed in parallel, multiple memory devices can include I/O interface circuitry to the same interface of memory controller 120. In an implementation of system 100 including one or more memory module(s) 170, I/O interface circuitry 142 may include interface hardware of memory module(s) 170 in addition to interface hardware for memory device(s) 140. Other memory controllers 120 may include multiple, separate interfaces to one or more memory devices of memory device(s) 140.

In some examples, memory controller 120 may be coupled with memory device(s) 140 via multiple signal lines. The multiple signal lines may include at least a clock (CLK) 132, a command/address (CMD) 134, and write data (DQ) and read data (DQ) 136, and zero or more other signal lines 138. According to some examples, a composition of signal lines coupling memory controller 120 to memory device(s) 140 may be referred to collectively as a memory bus. The signal lines for CMD 134 may be referred to as a "command bus", a "C/A bus" or an ADD/CMD bus, or some other designation indicating the transfer of commands. The signal lines for DQ 136 may be referred to as a "data bus".

According to some examples, independent channels may have different clock signals, command buses, data buses, and other signal lines. For these examples, system 100 may be considered to have multiple "buses," in the sense that an independent interface path may be considered a separate bus. It will be understood that in addition to the signal lines shown in FIG. 1, a bus may also include at least one of strobe signaling lines, alert lines, auxiliary lines, or other signal lines, or a combination of these additional signal lines. It will also be understood that serial bus technologies can be used for transmitting signals between memory controller 120 and memory device(s) 140. An example of a serial bus technology is 8B10B encoding and transmission of high-speed data with embedded clock over a single differential pair of signals in each direction. In some examples, CMD 134 represents signal lines shared in parallel with multiple memory device(s) 140. In other examples, multiple memory devices share encoding command signal lines of CMD 134, and each has a separate chip select (CS_n) signal line to select individual memory device(s) 140.

In some examples, the bus between memory controller 120 and memory device(s) 140 includes a subsidiary command bus routed via signal lines included in CMD 134 and a subsidiary data bus to carry the write and read data routed via signal lines included in DQ 136. In some examples, CMD 134 and DQ 136 may separately include bidirectional lines. In other examples, DQ 136 may include unidirectional write signal lines to write data from the host to memory and unidirectional lines to read data from the memory to the host.

According to some examples, in accordance with a chosen memory technology and system design, signals lines included in other 138 may augment a memory bus or subsidiary bus. For example, strobe line signal lines for a DQS. Based on a design of system 100, or memory technology implementation, a memory bus may have more or less bandwidth per memory device included in memory device(s) 140. The memory bus may support memory devices included in memory device(s) 140 that have either a ×32 interface, a ×16 interface, a ×8 interface, or other interface. The convention "×W." where W is an integer that refers to an interface size or width of the interface of memory device(s) 140, which represents a number of signal lines to exchange data with memory controller 120. The interface size of these memory devices may be a controlling factor on how many memory devices may be used concurrently per channel in system 100 or coupled in parallel to the same signal lines. In some examples, high bandwidth memory devices, wide interface memory devices, or stacked memory devices, or combinations, may enable wider interfaces, such as a ×128 interface, a ×256 interface, a ×512 interface, a ×1024 interface, or other data bus interface width.

In some examples, memory device(s) 140 and memory controller 120 exchange data over a data bus via signal lines included in DQ 136 in a burst, or a sequence of consecutive data transfers. The burst corresponds to a number of transfer cycles, which is related to a bus frequency. A given transfer cycle may be a whole clock cycle for transfers occurring on a same clock or strobe signal edge (e.g., on the rising edge). In some examples, every clock cycle, referring to a cycle of the system clock, may be separated into multiple unit intervals (UIs), where each UI is a transfer cycle. For example, double data rate transfers trigger on both edges of the clock signal (e.g., rising and falling). A burst can last for a configured number of UIs, which can be a configuration stored in a register, or triggered on the fly. For example, a sequence of eight consecutive transfer periods can be considered a burst length 8 (BL8), and each memory device(s) 140 can transfer data on each UI. Thus, a ×8 memory device operating on BL8 can transfer 64 bits of data (8 data signal lines times 8 data bits transferred per line over the burst). It will be understood that this simple example is merely an illustration and is not limiting.

According to some examples, memory device(s) 140 represent memory resources for system 100. For these examples, each memory device included in memory device(s) 140 is a separate memory die. Separate memory devices may interface with multiple (e.g., 2) channels per device or die. A given memory device of memory device(s) 140 may include I/O interface circuitry 142 and may have a bandwidth determined by an interface width associated with an implementation or configuration of the given memory device (e.g., ×16 or ×8 or some other interface bandwidth). I/O interface circuitry 142 may enable the memory devices to interface with memory controller 120. I/O interface circuitry 142 may include a hardware interface and operate in coordination with I/O interface circuitry 122 of memory controller 120.

In some examples, multiple memory device(s) 140 may be connected in parallel to the same command and data buses (e.g., via CMD 134 and DQ 136). In other examples, multiple memory device(s) 140 may be connected in parallel to the same command bus but connected to different data buses. For example, system 100 may be configured with multiple memory device(s) 140 coupled in parallel, with each memory device responding to a command, and accessing memory resources 160 internal to each memory device. For a write operation, an individual memory device of memory device(s) 140 may write a portion of the overall data word, and for a read operation, the individual memory device may fetch a portion of the overall data word. As non-limiting examples, a specific memory device may provide or receive, respectively, 8 bits of a 128-bit data word for a read or write operation, or 8 bits or 16 bits (depending for a ×8 or a ×16 device) of a 256-bit data word. The remaining bits of the word may be provided or received by other memory devices in parallel.

According to some examples, memory device(s) 140 may be disposed directly on a motherboard or host system platform (e.g., a PCB (printed circuit board) on which processor 110 is disposed) of a computing device. Memory device(s) 140 may be organized into memory module(s) 170. In some examples, memory module(s) 170 may represent dual inline memory modules (DIMMs). In some examples, memory module(s) 170 may represent other organizations or configurations of multiple memory devices that share at least a portion of access or control circuitry, which can be a separate circuit, a separate device, or a separate board from the host system platform. In some examples, memory module(s) 170 may include multiple memory device(s) 140, and memory module(s) 170 may include support for multiple separate channels to the included memory device(s) 140 disposed on them.

In some examples, memory device(s) 140 may be incorporated into a same package as memory controller 120. For example, incorporated in a multi-chip-module (MCM), a package-on-package with through-silicon via (TSV), or other techniques or combinations. Similarly, in some examples, memory device(s) 140 may be incorporated into memory module(s) 170, which themselves may be incorporated into the same package as memory controller 120. It will be appreciated that for these and other examples, memory controller 120 may be part of or integrated with processor 110.

As shown in FIG. 1, in some examples, memory device(s) 140 include memory resources 160. Memory resources 160 may represent individual arrays of memory locations or storage locations for data. Memory resources 160 may be managed as rows of data, accessed via wordline (rows) and bitline (individual bits within a row) control. Memory resources 160 may be organized as separate channels, ranks, and banks of memory. Channels may refer to independent control paths to storage locations within memory device(s) 140. Ranks may refer to common locations across multiple memory devices (e.g., same row addresses within different memory devices). Banks may refer to arrays of memory locations within a given memory device of memory device(s) 140. Banks may be divided into sub-banks with at least a portion of shared circuitry (e.g., drivers, signal lines, control logic) for the sub-banks, allowing separate addressing and access. It will be understood that channels, ranks, banks, sub-banks, bank groups, or other organizations of the memory locations, and combinations of the organizations, can overlap in their application to access memory resources 160. For example, the same physical memory locations can be accessed over a specific channel as a specific bank, which can also belong to a rank. Thus, the organization of memory resources 160 may be understood in an inclusive, rather than exclusive, manner.

According to some examples, as shown in FIG. 1, memory device(s) 140 include one or more register(s) 144. Register(s) 144 may represent one or more storage devices or storage locations that provide configuration or settings for operation memory device(s) 140. In one example, register(s) 144 may provide a storage location for memory device(s) 140 to store data for access by memory controller 120 as part of a control or management operation. For example, register(s) 144 may include one or more mode registers (MRs) and/or may include one or more multipurpose registers.

In some examples, writing to or programming one or more registers of register(s) 144 may configure memory device(s) 140 to operate in different "modes". For these examples, command information written to or programmed to the one or more register may trigger different modes within memory device(s) 140. Additionally, or in the alternative, different modes can also trigger different operations from address information or other signal lines depending on the triggered mode. Programmed settings of register(s) 144 may indicate or trigger configuration of I/O settings. For example, configuration of timing, termination, on-die termination (ODT), driver configuration, or other I/O settings.

According to some examples, memory device(s) 140 includes ODT 146 as part of the interface hardware associated with I/O interface circuitry 142. ODT 146 may provide settings for impedance to be applied to the interface to specified signal lines. For example, ODT 146 may be configured to apply impedance to signal lines include in DQ 136 or CMD 134. The ODT settings for ODT 146 may be changed based on whether a memory device of memory device(s) 140 is a selected target of an access operation or a non-target memory device. ODT settings for ODT 146 may affect timing and reflections of signaling on terminated signal lines included in, for example, CMD 134 or DQ 136. Control over ODT setting for ODT 146 can enable higher-speed operation with improved matching of applied impedance and loading. Impedance and loading may be applied to specific signal lines of I/O interface circuitry 142, 122 (e.g., CMD 134 and DQ 136) and is not necessarily applied to all signal lines.

In some examples, as shown in FIG. 1, memory device(s) 140 includes controller 150. Controller 150 may represent control logic within memory device(s) 140 to control internal operations within memory device(s) 140. For example, controller 150 decodes commands sent by memory controller 120 and generates internal operations to execute or satisfy the commands. Controller 150 may be referred to as an internal controller and is separate from memory controller 120 of the host. Controller 150 may include logic and/or features to determine what mode is selected based on programmed or default settings indicated in register(s) 144 and configure the internal execution of operations for access to memory resources 160 or other operations based on the selected mode. Controller 150 generates control signals to control the routing of bits within memory device(s) 140 to provide a proper interface for the selected mode and direct a command to the proper memory locations or addresses of memory resources 160. Controller 150 includes command (CMD) logic 152, which can decode command encoding received on command and address signal lines. Thus, CMD logic 152 can be or include a command decoder. With command logic 152, memory device can identify commands and generate internal operations to execute requested commands.

Referring again to memory controller 120, memory controller 120 includes CMD logic 124, which represents logic and/or features to generate commands to send to memory device(s) 140. The generation of the commands can refer to the command prior to scheduling, or the preparation of queued commands ready to be sent. Generally, the signaling in memory subsystems includes address information within or accompanying the command to indicate or select one or more memory locations where memory device(s) 140 should execute the command. In response to scheduling of transactions for memory device(s) 140, memory controller 120 can issue commands via I/O interface circuitry 122 to cause memory device(s) 140 to execute the commands. In some examples, controller 150 of memory device(s) 140 receives and decodes command and address information received via I/O interface circuitry 142 from memory controller 120. Based on the received command and address information, controller 150 may control the timing of operations of the logic, features and/or circuitry within memory device(s) 140 to execute the commands. Controller 150 may be arranged to operate in compliance with standards or specifications such as timing and signaling requirements for memory device(s) 140. Memory controller 120 may implement compliance with standards or specifications by access scheduling and control.

According to some examples, memory controller 120 includes scheduler 130, which represents logic and/or features to generate and order transactions to send to memory device(s) 140. From one perspective, the primary function of memory controller 120 could be said to schedule memory access and other transactions to memory device(s) 140. Such scheduling can include generating the transactions themselves to implement the requests for data by processor 110 and to maintain integrity of the data (e.g., such as with commands related to refresh). Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands or a combination.

In some examples, memory controller 120 includes refresh (REF) logic 126. REF logic 126 may be used for memory resources that are volatile and need to be refreshed to retain a deterministic state. REF logic 126, for example, may indicate a location for refresh, and a type of refresh to perform. REF logic 126 may trigger self-refresh within memory device(s) 140 or execute external refreshes which can be referred to as auto refresh commands by sending refresh commands, or a combination. According to some examples, system 100 supports all bank refreshes as well as per bank refreshes. All bank refreshes cause the refreshing of banks within all memory device(s) 140 coupled in parallel. Per bank refreshes cause the refreshing of a specified bank within a specified memory device of memory device(s) 140. In some examples, controller 150 within memory device(s) 140 includes a REF logic 154 to apply refresh within memory device(s) 140. REF logic 154, for example, may generate internal operations to perform refresh in accordance with an external refresh received from memory controller 120. REF logic 154 may determine if a refresh is directed to memory device(s) 140 and determine what memory resources 160 to refresh in response to the command.

According to some examples, memory controller 120 includes I/O training circuitry 128. I/O training circuitry 128 refers to circuitry in memory controller 120 to execute training of I/O interconnections between memory controller 120 and memory device(s) 140. Training can refer to the application of different settings to determine a setting that provides improved signaling quality. Training may include an iterative operation to test different settings, which can include voltage settings, timing settings, or other settings, or a combination. I/O training circuitry 128 may set the parameters associated with transceivers of I/O interface circuitry 142 and I/O interface circuitry 122. In some examples, I/O training circuitry 128 enables command bus signal training for signal lines included in CMD 134.

Training may refer to testing and setting of electrical parameters or timing parameters or both that control a data signal eye. The data signal eye refers to timing and shape of rising and falling edges, on average, for a signal received on one or more signal lines. The height and width of the eye provides compliance with timing and voltage level requirements needed to trigger a logic value on the one or more signal lines or a change in logic value, or both. Command bus training may be in accordance with any example of command bus or C/A bus training described herein. In some examples, I/O training circuitry 128 may provide for a command bus training mode in accordance with any example described herein.

In some examples, memory device(s) 140 include I/O sampling and feedback logic 180. I/O training circuitry 128 may work in coordination with CMD logic 124 to enable the testing of various signaling parameters to train signals routed via various signal lines coupled between memory controller 120 and memory device(s) 140. I/O sampling and feedback logic 180 may sample these various signal lines during training and provide feedback to memory controller 120 to identify what settings provide signaling characteristics that will enable memory controller 120 and memory device(s) 140 to exchange information, such as commands from memory controller 120 and data written to or received from memory device(s) 140.

According to some examples, based on a command from CMD logic 124, memory device(s) 140 enter a command bus training mode. If memory device(s) 140 are arranged or configured to operate according to the proposed DDR5 specification, the command bus training mode may be CATM as described in more detail below. If memory device(s) 140 are arranged or configured to operate according to the LPDDR4 or LPDDR5 specifications, the command bus training mode may be an LPDDR4/LPDDR5 CBT mode. As described more below, either type of command bus training mode may enable a system such as system 100 to train a CA signal routed over command bus signal lines to one or more memory devices such as CA signals routed over signal lines included in CMD 134 to memory device(s) 140. For example, with memory device(s) 140 in a command bus training mode, logic and/or features of memory controller 120 such as CMD logic 124 may cause commands and/or signals to be sent to memory device(s) 140 to train voltage margining, timing margining or phase margining or a combination (which can collectively be referred to as signal margining) for a CA signal routed via CMD 134 to align the CA signal with the memory subsystem clock signal of a clock signal included in CLK 132.

Also, as described more below, command logic of a memory controller similar to CMD logic 124 of memory controller 120 may include or have access to error detecting circuitry such as I/O training circuitry 128 that is capable of facilitating error detection of sampled signals by memory devices based on a common set of CA algorithms to generate CA patterns for both DDR5 memory devices or LPDDR4/LPDDR5 memory devices placed in respective CATM or CBT modes. For example, I/O training circuitry included within memory controller 120 may include at least some error checking hardware that enables CMD logic 124 to quickly and efficiently determine whether sampled CA patterns are correct or have one or more errors. According to some examples, this type of I/O training circuitry including or having access to error checking hardware may enable a memory controller to operate with a wider range of memory devices to include operating with DDR5 or LPDDR4/LPDDR5 memory devices utilizing a common set of CA patterns and/or CA training algorithms to train command buses for the different types of memory devices or technologies. Use of error checking hardware may also simplify coordination work for firmware or software needed when implementing command bus training for LPDDR4/LPDDR5 memory devices.

Figure 2:
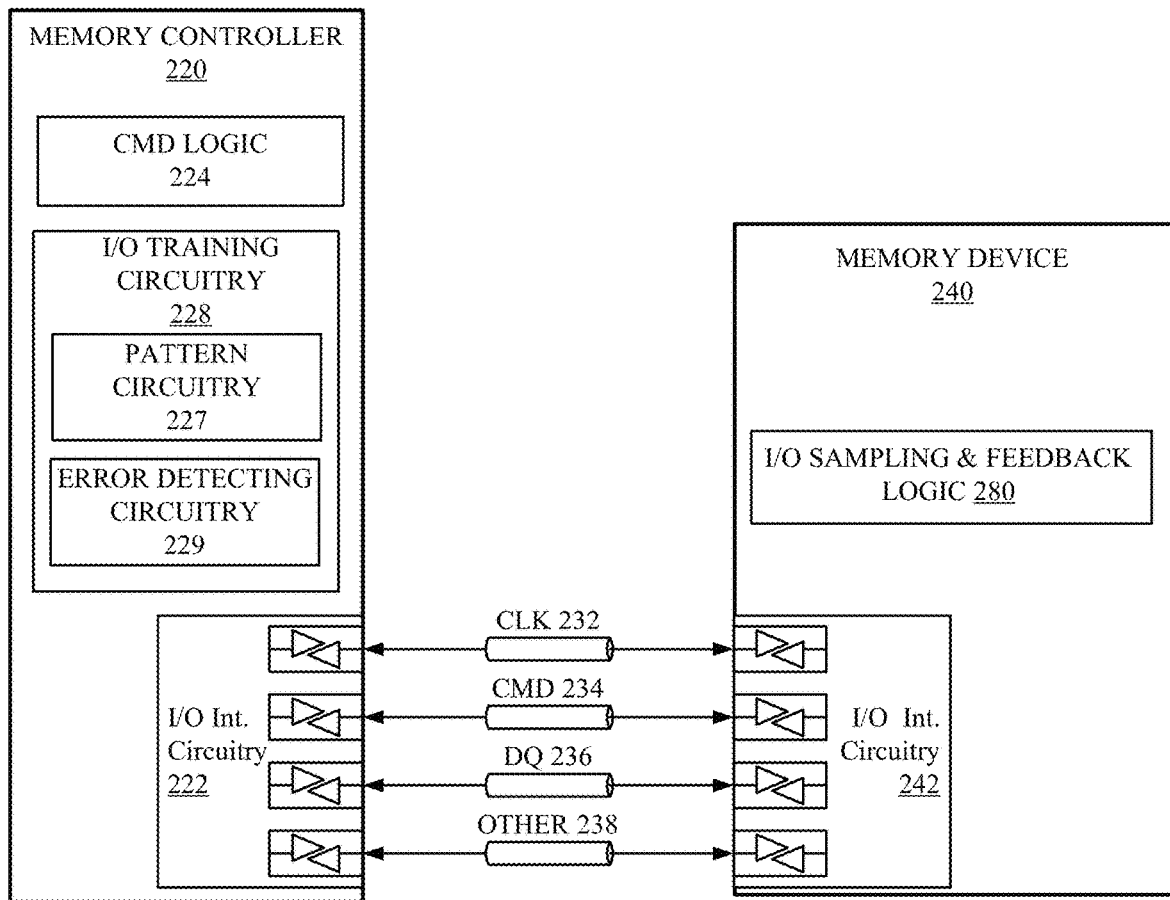
FIG. 2 illustrates an example second system.

FIG. 2 illustrates an example system 200. In some examples, as shown in FIG. 2, system 200 includes a memory controller 220 and a memory device 240. For these examples, also as shown in FIG. 2, memory controller 220 includes, but is not limited to, an CMD logic 224, I/O training circuitry 228 and I/O interface circuitry 222. CLK 232, CMD 234, DQ 236 and other 238, as shown in FIG. 2, couple I/O interface circuitry 222 with I/O interface circuitry 242. CLK 232, CMD 234, DQ 236 and other 238 may include similar signal lines and memory bus functionality as described above for CLK 132, CMD 134, DQ 136 and other 138 depicted in FIG. 1.

In some examples, as shown in FIG. 2, memory device 240 includes I/O sampling & feedback logic 280 and I/O interface circuitry 242. Logic and/or features of I/O training circuitry 228 such as a pattern circuitry 227 or error detecting circuitry 229 may be capable of facilitating command bus training of either DDR5 or LPDDR4/5 memory devices. For the example system 200, memory device 240 may be arranged or designed to operate in compliance with the LPDDR4 specification or the LPDDR5 specification. For LPDDR4/5 memory devices, CMD logic 224 may indicate, in some examples, that at least some compression of sampled CA patterns returned to memory controller 220 is needed by error detecting circuitry 229 to provide a compressed representation of the sample CA patterns. As described more below, error detecting circuitry 229 may be arranged to implement various compression schemes on returned CA patterns.

According to some examples, pattern circuitry 227 may include programmable logic or features to enable pattern circuitry 227 to generate CA patterns based on one or more CA training algorithms provided by firmware or software executed by CMD logic 224. For example, firmware or software executed by CMD logic 224 may provide the one or more CA training algorithms to pattern circuitry 227 to cause the generation of CA patterns. Although not shown, in FIG. 2, pattern circuitry 227 may utilize one or more types of circuitry to cause a generation of pseudo random CA patterns such as one or more linear-feedback shift registers (LFSRs). Seed values, for example, may be indicated in one or more CA training algorithms and then used by pattern circuitry 227 to cause the generation of the pseudo random CA patterns. In some examples, in order to simulate impacts of complex cross talk or power delivery stress over signals routed via signal lines included in CMD 234 coupled between memory controller 220 and memory device 240, pattern circuitry 227 may utilize multiple LFSRs. Pattern circuitry 227 may also create different frequency content by masking an LFSR pattern using a variable frequency square wave. Memory controller 220 may also enter various internal states to expose a command bus training regimen to side effects of these internal states. The internal states may include, but are not limited to, low power states or updating internal transmit settings based on temperature changes. As described in more detail below, generated patterns may be routed via command bus signal lines included in CMD 234 based on initiation of the CBT mode that is implemented according to the LPDDR4 or LPDDR5 specifications.

In some examples, error detecting circuitry 229 of I/O training circuitry 228 may include circuitry capable of facilitating error detection of sampled CA patterns observed by I/O sampling & feedback logic 280 responsive to initiation of the CBT mode. For these examples, a sampled CA pattern may be observed by I/O sampling & feedback logic 280 based on the CA patterns being routed via signal lines included in CMD 234. The sampled CA pattern may be sent back via a data bus that has signal lines included in DQ 236. In one example, error detecting circuitry 229 may include circuitry to compress the returned sampled CA pattern to enable firmware or software executed by CMD logic 224 to determine whether the sampled CA pattern is correct or has one or more errors.

According to some examples, compression of the returned sampled CA pattern may include use of one or more exclusive OR (XOR) gates to compress the returned sampled CA pattern down to a single parity bit value. For these examples, pattern circuitry 227 may implement a CA training algorithm that causes pseudo random patterns to be generated on an even number of signal lines included in CMD 234 to create even parity. Thus, if the compressed sampled CA pattern generated a parity value of "0", software or firmware implemented by CMD logic 224 may determine that the CA pattern was sampled with no errors. If the compressed sampled CA pattern generated a parity value of "1", software or firmware implemented by CMD logic 224 may determine that the CA pattern was sampled with errors and corrective actions are needed (e.g., adjustments to electrical or timing parameters related to signals sent via signal lines included in CMD 234).

In some examples, compression of the sampled CA pattern may include use of circuitry to calculate a cyclic redundancy check (CRC) value to represent a compressed sampled CA pattern. For these examples, pattern circuitry 227 may implement a CA training algorithm that has an expected M+1 bit CRC value (where "M" represents any positive whole integer) for a CA pattern generated on signal lines included in CMD 234. The expected M+1 CRC value may be maintained by software or firmware executed by CMD logic 224. When the sampled CA pattern is returned via DQ 236, error detecting circuitry 229 calculates a CRC value for the sampled CA pattern. The CRC value may then be forwarded to the software or firmware executed by CMD logic 224. The software or firmware executed by CMD logic 224 may then determine if the CRC value representing the compressed sampled CA pattern matches the expected M+1 CRC value for the generated/sent CA pattern. If the provided CRC value matches the expected M+1 CRC value, the software or firmware determines that there are no errors in the sampled CA pattern. If the provided CRC value does not match the expected M+1 CRC value, the software or firmware determines that the sampled CA pattern includes errors and corrective actions are needed.

According to some examples, compression of the sampled CA pattern may include use of circuitry to generate a signature value to represent a compressed sampled CA pattern. The circuitry used to generate the signature value may include a multi-input shift register (MISR). For these examples, pattern circuitry 227 may implement a CA training algorithm that has an expected M+1 bit signature value for a CA pattern generated on signal lanes included in CMD 234. The expected M+1 signature value may be maintained by software or firmware executed by CMD logic 224. When the sampled CA pattern is returned via DQ 236, error detecting circuitry 229 calculates a signature value for the sampled CA pattern by inputting sampled CA pattern into an MISR. A signature value outputted from the MISR may then be forwarded to the software or firmware executed by CMD logic 224. The software or firmware executed by CMD logic 224 may then determine if the signature value representing the compressed sampled CA pattern matches the expected M+1 signature value for the generated/sent CA pattern. If the provided signature value matches the expected M+1 signature value, the software or firmware determines that there are no errors in the sampled CA pattern. If the provided signature value does not match the expected M+1 signature value, the software or firmware determines that the sampled CA pattern includes errors and corrective actions are needed.

Figure 3:
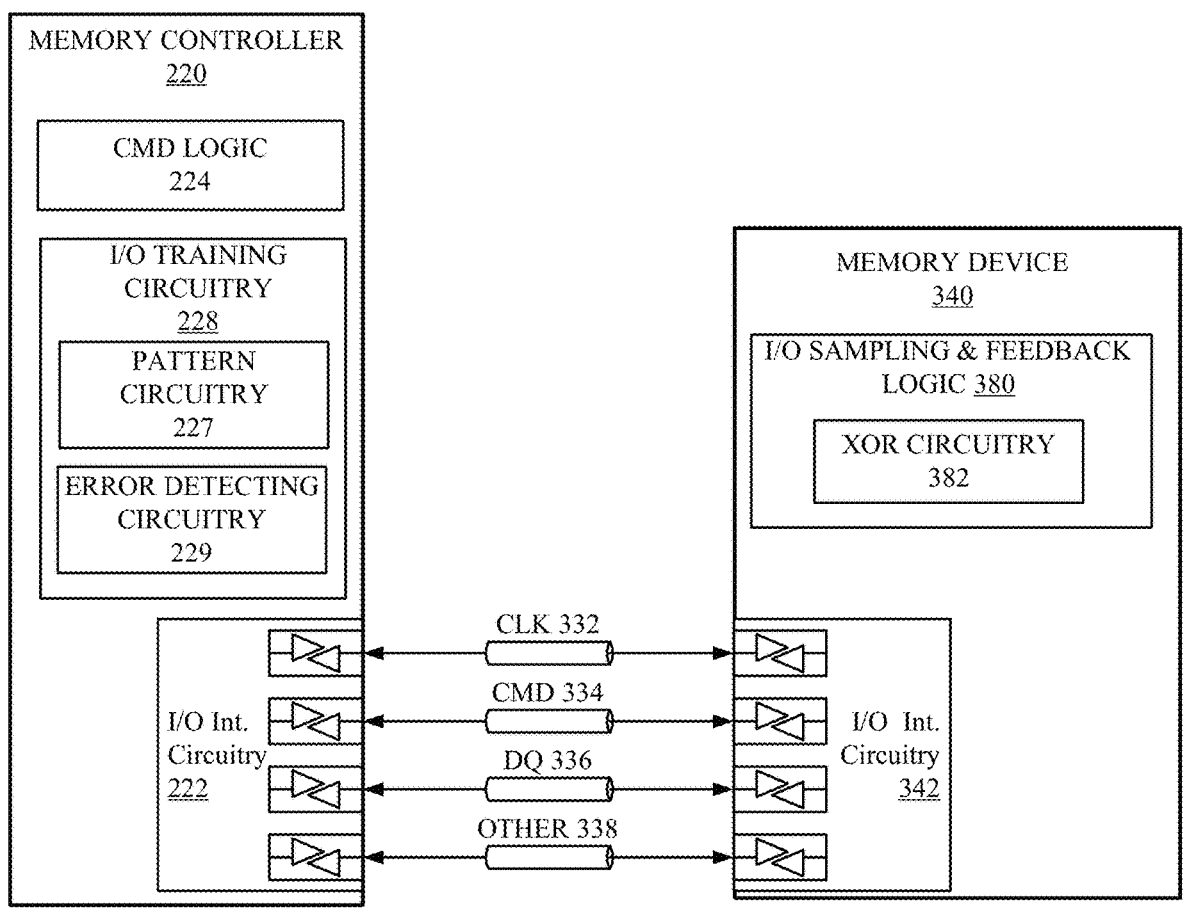
FIG. 3 illustrates an example third system.

FIG. 3 illustrates an example system 300. In some examples, as shown in FIG. 3, system 300 includes memory controller 220 as described above for FIG. 2 and a memory device 340. For these examples, CLK 332, CMD 334, DQ 336 and other 338 shown in FIG. 3 as coupling I/O interface circuitry 222 with I/O interface circuitry 342 may include similar signal lines and memory bus functionality as described above for CLK 132, CMD 134, DQ 136 and other 138 depicted in FIG. 1.

In some examples, as mentioned previously, logic and/or features of I/O training circuitry 228 such as a pattern circuitry 227 or error detecting circuitry 229 may be capable of facilitating command bus training of either DDR5 or LPDDR4/5 memory devices. For the example system 300, memory device 340 may be arranged or designed to operate in compliance with the proposed DDR5 specification. For DDR5 memory devices, CMD logic 224 may indicate that no compression of sampled CA patterns returned to memory controller 220 is needed by error detecting circuitry 329. No compression is needed due to DDR5 memory devices including XOR circuitry at the memory devices that serve to compress sampled CA patterns. As described more below, I/O sampling & feedback logic 380 includes XOR circuitry 382 to compress sampled CA patterns at memory device 340.

According to some examples, as mentioned above, pattern circuitry 227 may include programmable logic or features to enable pattern circuitry 227 to generate CA patterns based on one or more CA training algorithms provided by firmware or software executed by CMD logic 224. As described in more detail below, generated patterns may be routed via command bus signal lines included in CMD 334 based on initiation of CATM that is implemented according to the proposed DDR5 specification.

In some examples, error detecting circuitry 229 of I/O training circuitry 228 may include circuitry capable of facilitating error detection of sampled CA patterns observed by I/O sampling & feedback logic 380 responsive to initiation of CATM. For these examples, the sampled CA pattern may be observed by I/O sampling & feedback logic 380 based on the CA patterns being routed via signal lines included in CMD 334. The sampled CA pattern may be compressed to a parity value by XOR circuitry 382 and the parity value is sent back via signal lines included in DQ 336.

In one example, error detecting circuitry 229 may forward the parity value to software or firmware implemented by CMD logic 224. Also, for these examples, pattern circuitry 227 may implement a CA training algorithm that causes pseudo random patterns to be generated on an even number of signal lanes included in CMD 334 to create even parity. Thus, if the returned parity value is "0", software or firmware implemented by CMD logic 324 may determine that the CA pattern was sampled with no errors. If the returned parity value is "1", software or firmware implemented by CMD logic 324 may determine that the CA pattern was sampled with errors and corrective actions are needed (e.g., adjustments to electrical or timing parameters related to signals sent via signal lines included in CMD 334).

Figure 4A:
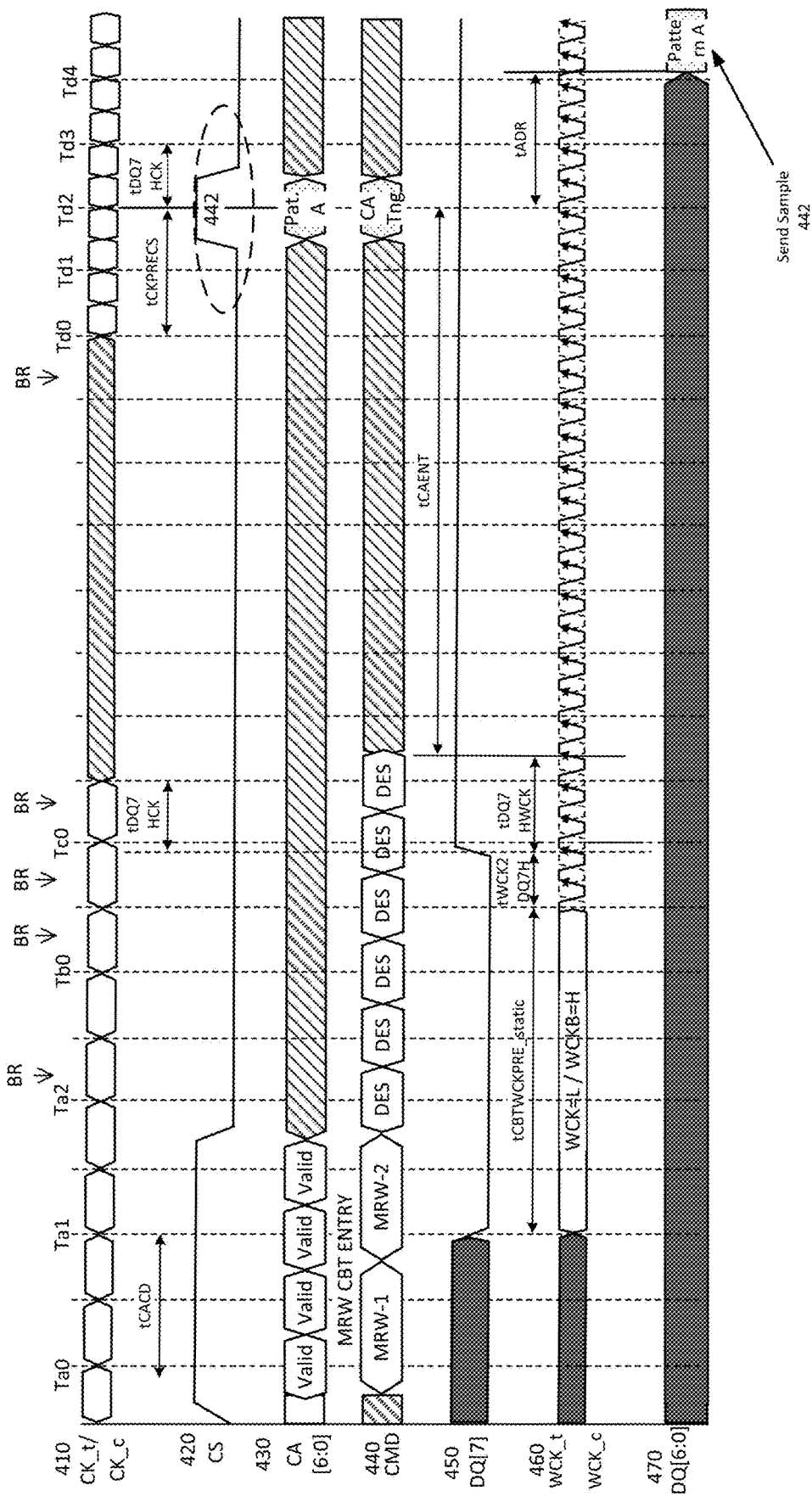
FIGS. 4A-B illustrate an example first timing diagram.
Figure 4B:
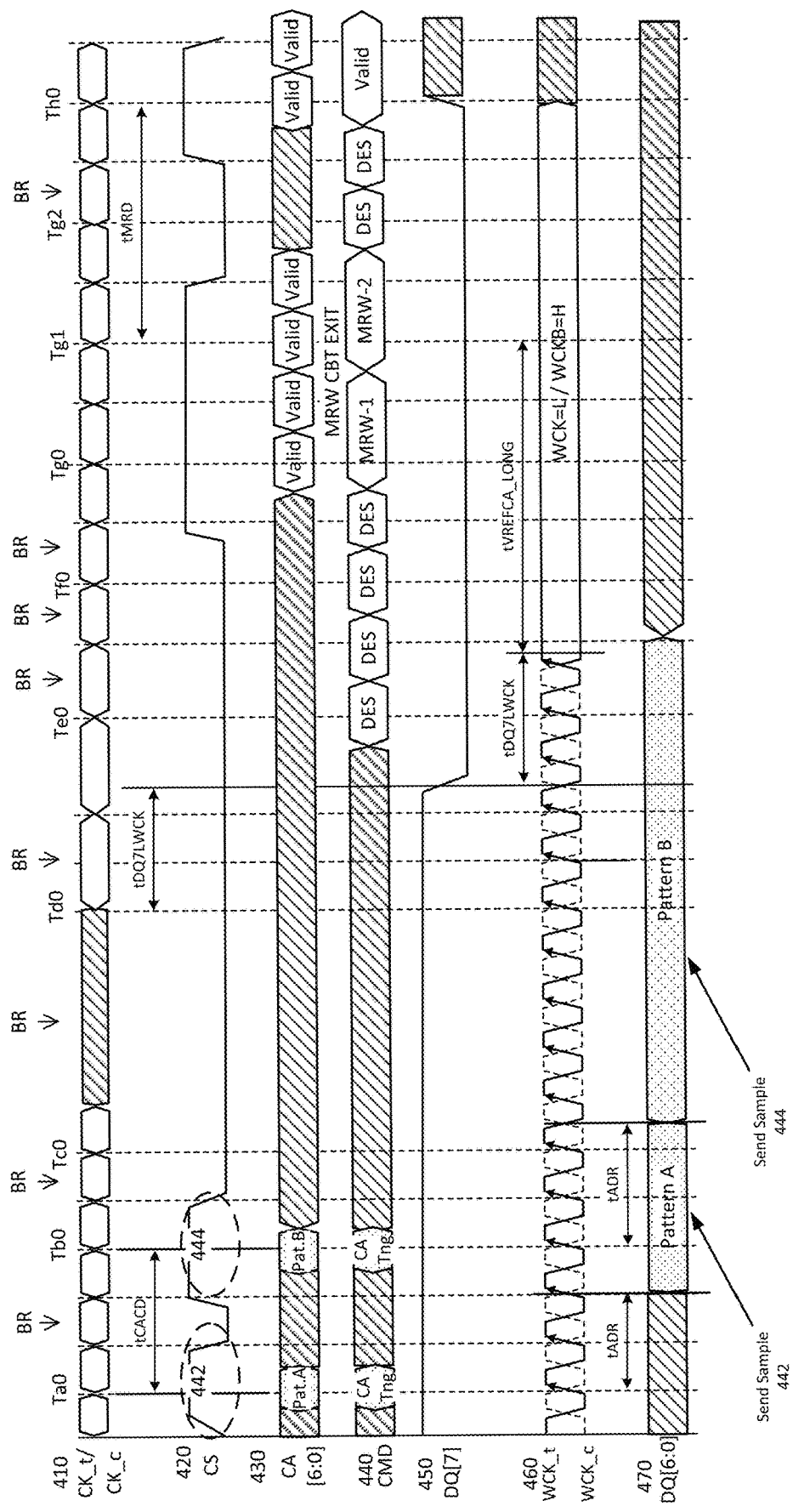

FIGS. 4A and 4B illustrate an example diagram 400. In some examples, diagram 400 may be timing diagram associated with implementing model command bus training (CBT) for a memory device arranged to operate incompliance with the LPDDR5 specification such as memory device 240 shown in FIG. 2 and described above. Examples are not limited to model CBT.

According to some examples, signal 410 represents a clock signal routed via signal lines included in CLK 332, which can include a primary clock signal CK_t, and a complementary clock signal CK_c. For model CBT, the clock signal runs continuously. The timing of CLK signal 410 has different timing indicators, such as Ta0, Ta1, . . . . Td0, Td1, . . . , and so forth. The various sections of timing indicate timing that is not necessarily contiguous, although it may be. There are multiple breaks (BR) illustrated. The breaks are representative only. In some examples, command bus training while memory device 340 is implementing model CBT may establish alignment between the CK signal 410 and command bus (CA) signal 430.

In some examples, CA signal 420 illustrates an example of CA signals routed via a command bus, which can include 7 signal lines [6:0] as shown in FIG. 4. For example, the 7 signal lines of CA signal 420 may be routed through CMD 334 coupled between memory controller 220 and memory device 240. The number of signal lines indicated in FIG. 4 is for example only.

According to some examples, logic and/or features of memory controller 220 may enable model CBT by issuing a first mode register write (MRW-1) command followed by a second MRW-2 command as indicated in FIG. 4A that shows CMD signal 430 indicating entry into CBT. FIG. 4A also shows that CA signal 420 indicates valid MRW commands (around approximately ta0). Valid MRW commands are issued while asserting chip select (CS_n) signal 440 as shown in FIG. 4A. CMD signal 430 shows what command will be decoded based on the signals of CA signal 420. In some examples, the MRW commands may be issued by memory controller 220 writing to or programming a multi-purpose register of a mode register at memory device 240. The model CBT MRW commands may be triggered by writing or programming a specific bit pattern to the multi-purpose register.

According to some examples, WCK_t, WCK_c signal 460 may represent signals sent via signal lines included in CLK 132 that capture toggling of a state of DQ[7] signal 450. In some examples, DQ[7] signal 450 may represent a signal line coupled to an 8th pin of an 8 pin data bus. While DQ[6:0] signal 460 may represent signal lines coupled to the other 7 pins of the 8 pin data bus. For these examples, DQ[7] signal 450 and DQ[6:0] signal 460 may be included in DQ 236 coupled between memory controller 220 and memory device 240.

In some examples, as shown in FIG. 4A, following tCAENT, CS_n signal 420 may be driven high while DQ[7] signal 450 is also driven high, and CA pattern A is sent from memory controller 220 via CA [6:0] signal 430 for command bus training as indicated by CMD signal 440 at around Td1 (e.g., based on patterns generated by pattern circuitry 227). For these examples, a sample 442 may be observed as CA pattern A. Sample 442, for example, may be observed by I/O sampling & feedback logic 280 of memory device 240.

As shown in FIG. 4A, sample 442 may then be sent via DQ[6:0] signal 470 to indicate a resulting sampled CA pattern A at around Td4.

As shown in FIG. 4B, CA pattern A and its corresponding sample 442 is shown followed by a second CA pattern B and corresponding sample 444. Also, FIG. 4B shows both these samples being sent via DQ[6:0] signal 470 at around TB0 and Td0. Examples are not limited to two CA patterns, any number of CA patterns may be received and sent while memory device 240 is in model CBT.

In some examples, as shown in FIG. 4B, first and second MRW commands are sent on CMD signal 440 at around tg0. For these examples, CS_n signal 420 is driven high and DQ[7] signal 450 is driven low to issue MRW-1 and MRW-2 commands to exit model CBT. After tMRD, memory device 240 may then be ready for normal operation.

FIG. 5 illustrates an example table 500. In some examples, table 500 include AC parameters for command bus training for a memory device implementing model CBT as described above for diagram 400 in FIGS. 4A and 4B and as described in the LPDDR5 specification. The AC parameters included in table 500 refer to the timing parameters for signaling on the signal lines while the memory device implements model CBT. For these examples, the signaling occurs with either rising or falling edges or both. The timing parameters included in table 500 refer to requirements to meet timing from one signal change to another, where a signal change triggers an operation by one or more logic, features or circuitry of the memory device.

Row 502 identifies tCBTWCKPRE_static, which represents a timing parameter that defines a static WCK period associated with toggling a DQ[7] signal. Row 504 identifies tWCK2DQYH, which represents a timing parameter for a set-up margin between the DQ[7] signal and a WCK_t. WCK_c signal. Row 506 identifies tDQ7HWCK, which represents a timing parameter for a hold margin between the DQ[7] signal and a WCK_t. WCK_c signal. Row 508 identifies tDQ7HCK, which represents a timing parameter for clock and command valid after the DQ[7] signal is asserted (high). Row 510 identifies tCHPRECS, which represents a valid clock requirement before a CS_n signal is asserted. Row 512 identifies tCKPSTCS, which represents a timing parameter for a valid clock requirement after the CS_n signal is asserted. Row 514 identifies tCAENT, which represents a timing parameter for a delay time from when the DQ[7] signal is asserted to CA bus training for a given CA pattern. Row 516 identifies tADR, which represents a timing parameter for an asynchronous data read. Row 518 identifies tCACD, which represents a timing parameter for CA bus training command to CA bus training command delay. Row 520 identifies tCKDQ7L, which represents a timing parameter for a CK_t, CK_c signal and a command valid via a CA [6:0] signal before the DQ[7] signal is deasserted (low). Row 522 identifies tDQ7LWCK, which represents a timing parameter for the DQ[7] signal being deasserted to static WCK.

The illustrated example table 500 indicates a minimum/maximum times in either nanoseconds (ns) or clock cycles for each parameter/symbol. In some examples, a CK cycle may be based on a CK_t, CK_c signal and a WCK cycle may be based on a WCK_t, WCK_c signal.

Figure 6:
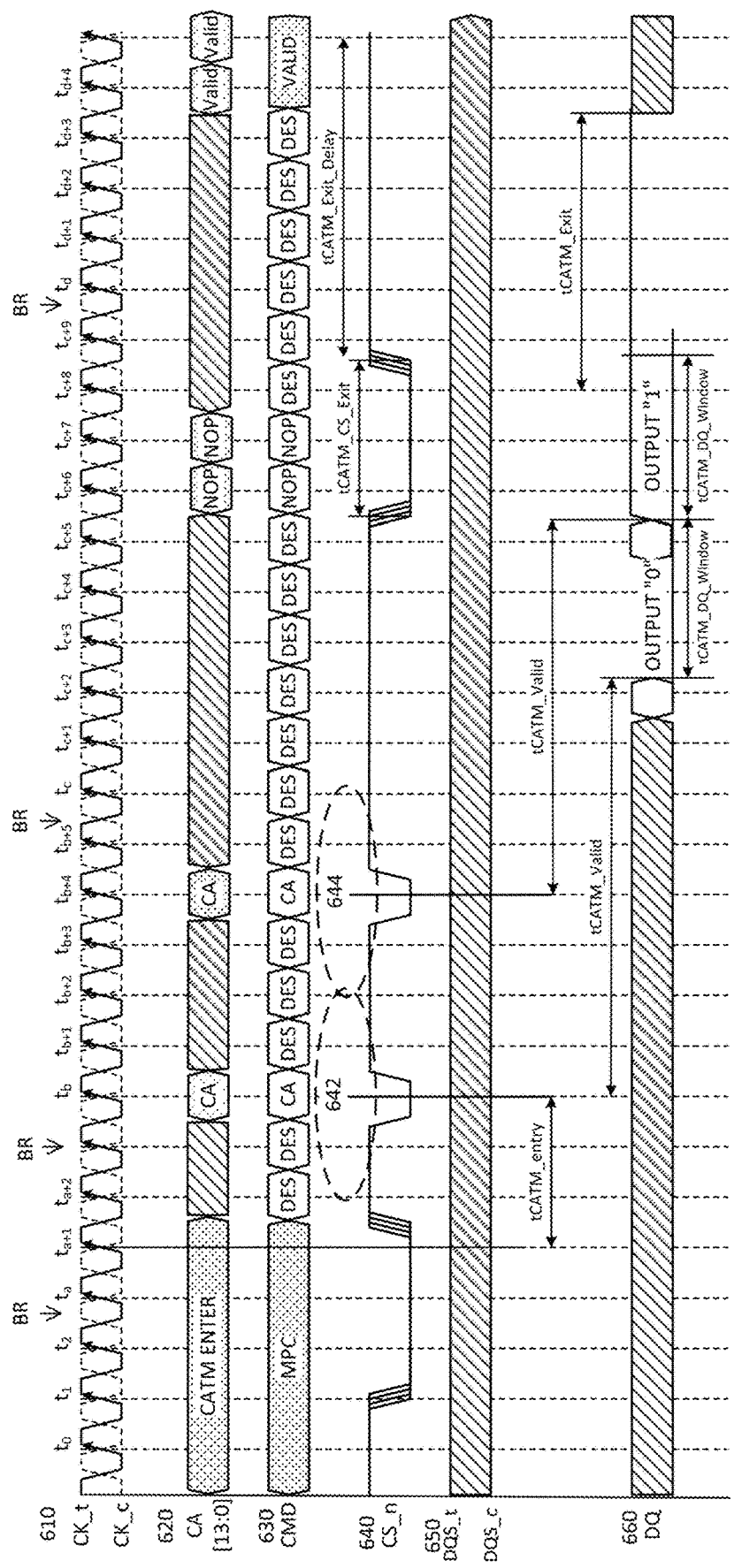
FIG. 6 illustrates an example timing second diagram.

FIG. 6 illustrates an example diagram 600. In some examples, diagram 600 may be timing diagram associated with implementing CATM for a memory device arranged to operate in compliance with the proposed DDR5 specification such as memory device 340 shown in FIG. 3 and described above.

According to some examples, signal 610 represents a clock signal routed via signal lines included in CLK 332, which can include a primary clock signal CK_t, and a complementary clock signal CK_c. For CATM, the clock signal runs continuously. The timing of CLK signal 610 has different timing indicators, such as t0, t1, . . . , t(a+1), t(a+2), . . . , and so forth. The various sections of timing indicate timing that is not necessarily contiguous, although it may be. There are multiple breaks (BR) illustrated. The breaks are representative only. In some examples, command bus training while memory device 340 is implementing CATM may establish alignment between the CK signal 610 and command bus (CA) signal 620.

In some examples, CA signal 620 illustrates an example of a CA signal routed via a command bus, which can include 14 signal lines [13:0] as shown in FIG. 6. For example, the 14 signal lines of CA signal 620 may be routed through CMD 334 coupled between memory controller 220 and memory device 340. The number of signal lines indicated in FIG. 6 is for example only.

According to some examples, logic and/or features of memory controller 220 may enable CATM by issuing a multipurpose command (MPC) as indicated by CMD signal 630. CA signal 620 illustrates a CATM enter command (around approximately t0). CATM is exited or disabled based on asserting chip select (CS_n) signal 640 for 2 or more cycles of CK signal 610 (around approximately tc+6 to tc+8), while sending a no operation (NOP) command via CA signal 620 as shown in FIG. 6. CMD signal 630 illustrates what command will be decoded based on the signals of CA signal 620. In some examples, the MPC may be issued by memory controller 220 writing to or programming a multipurpose register of a mode register at memory device 340. The CATM enter command may be triggered by writing or programming a specific bit pattern to the multipurpose register.

In some examples, the MPC extends beyond multiple tCK cycles, during which CS_n signal 620 is asserted for only a single tCK cycle while in CATM. Once in CATM no other commands will be interpreted by memory device 340. Memory device will only sample CA patterns sent from pattern circuitry 227, generate a parity value by XOR circuitry 382 and send back parity values for the sampled CA patterns via DQ signal 660. In some examples, as shown in FIG. 6, while in CATM, memory controller 220 holds or maintains CA signal 620 at a deselect (DES) command encoding and holds CA signal at CA command when a CA pattern is not being sampled from CA signal 620. As seen in CMD signal 630, the difference between a DES command and a CA command is the assertion or deassertion of CS_n signal 640.

According to some examples, DQS_t and DQS_c signal 650 represent a data strobe signal (DQS), which may include complementary DQS_t and DQS_c signals. The specific signaling of the data strobe conveyed via DQS_t and DQS_c signal 650 is not limiting on diagram 600. CS_n signal 640 may represent a chip select signal for memory device 340, where I/O sampling & feedback logic 380 may obtain multiple samples such as samples 642 and 644. In some examples, once memory device 340 has CATM enabled, I/O sampling & feedback logic 380 samples a CA pattern sent on CA signal 620 on a rising CK edge, starting with a rising edge of clock signal 610 after a delay of tCATM_Entry, which represents a delay period that can begin after a tCATM_Entry. More or fewer samples can be used in alternate implementations.

In some examples, the delay from when samples 642 or 644 is observed to when the output of the a respective parity value (e.g., determined by XOR circuitry 382) cause an output signal via DQ signal 660 is specified as tCATM_Valid. The time period tCATM_DQ_Window represents a period of time during which I/O sampling & feedback logic 380 or memory device 340 drives the output result of respective parity values on DQ signal 660 and can be shorter or longer than what is shown in FIG. 6, depending on the system configuration. I/O sampling & feedback logic 380 may drive the outputs as indicating a value of 0 or 1 depending on the parity value. For example, as shown in FIG. 6, the output on DQ signal 660 is "0" for sample 642 and "1" for sample 644.

FIG. 7 illustrates an example table 700. In some examples, table 700 include AC parameters for command bus training for a memory device implementing CATM as described above for diagram 600 in FIG. 6 and in the proposed DDR5 specification. The AC parameters included in table 700 refer to the timing parameters for signaling on the signal lines while the memory device implements CATM. For these examples, the signaling occurs with either rising or falling edges or both. The timing parameters included in table 700 refer to requirements to meet timing from one signal change to another, where a signal change triggers an operation by one or more logic, features or circuitry of the memory device.

Row 702 identifies tCATM_Entry, which represents a timing parameter that defines a delay or window or time between registration of the CATM entry command and the start of obtaining samples for command bus training. Row 704 identifies tCATM_Exit, which represents a timing parameter that defines a time between registration of the CATM exit command and the end of CATM. Row 706 identifies tCATM_Exit_Delay, which represents a timing parameter that defines a delay time after a CATM exit indication. Row 708 identifies tCATM_Valid, which represents a timing parameter from sample evaluation to output of the sample evaluation results on a data bus (DQ). For rows 702 and 706 a minimum time of 20 nanoseconds (ns) is indicated. For rows 704 and 708, respective maximum times of 14 ns and 20 ns are indicated.

Row 710 identifies tCATM_DQ_Window, which represents a time that the output is available on the data bus (DQ). The time the output is available defines a window during which a memory controller can read the result. The illustrated example table indicates a minimum time available of 2 nCK or two clock cycles.

Row 712 identifies tCATM_CS_Exit, which represents a time that the CS_n signal is held low to register an exit command. Reference to holding the CS_n signal low can refer to an operation by a memory controller to drive a logic low on the CS_n signal line. In the example of table 700, both parameters are illustrated as having a minimum time of 2 nCK and a maximum time of 8 nCK.

Included herein is a logic flows representative of example methodologies for performing novel aspects of the disclosed architecture. While, for purposes of simplicity of explanation, the one or more methodologies shown herein are shown and described as a series of acts, those skilled in the art will understand and appreciate that the methodologies are not limited by the order of acts. Some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

A logic flow and/or portions of a logic flow may be implemented in software, firmware, and/or hardware. In software and firmware embodiments, a logic flow may be implemented by computer executable instructions stored on at least one non-transitory computer readable medium or machine readable medium, such as an optical, magnetic or semiconductor storage. The embodiments are not limited in this context.

Figure 8:
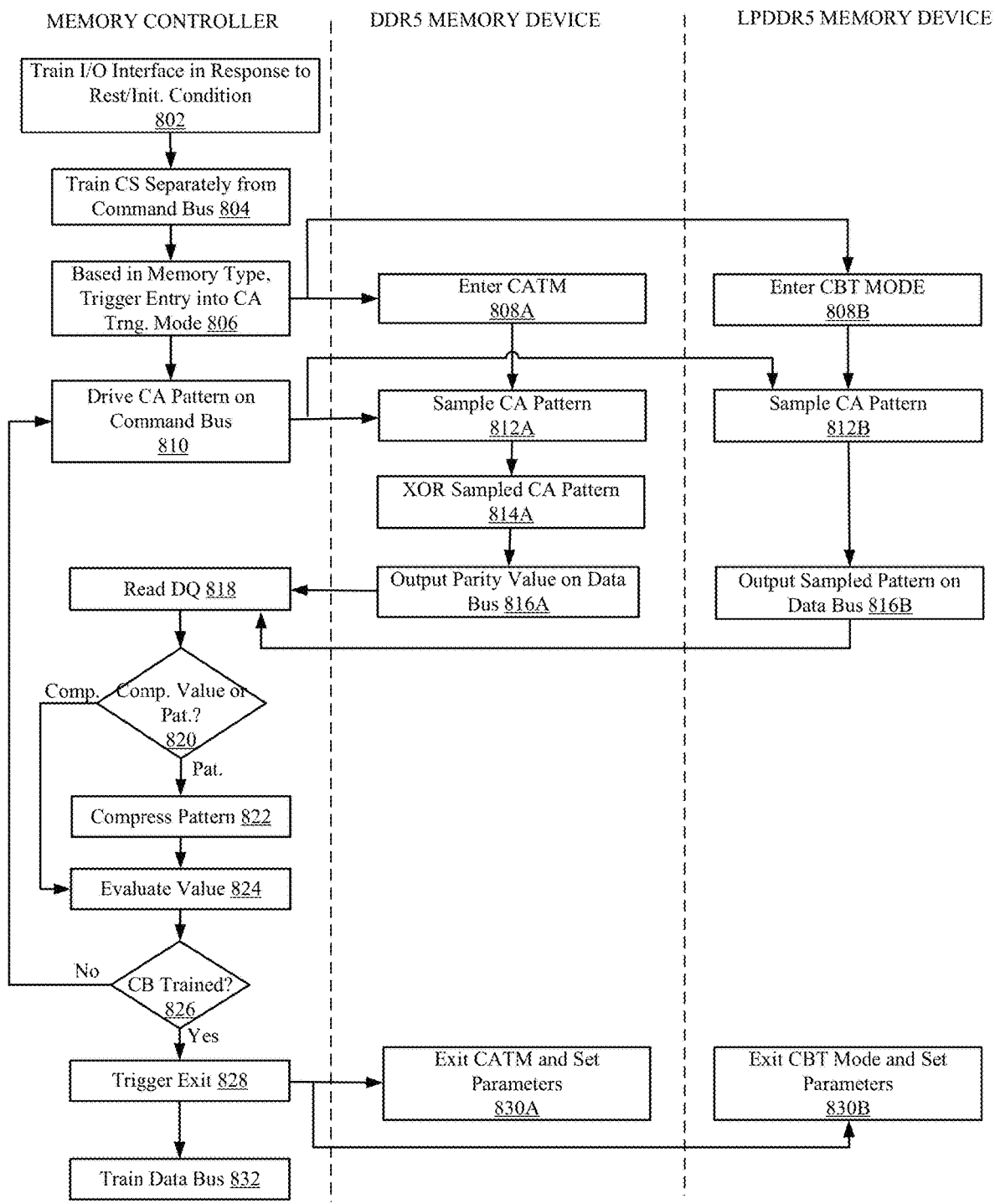
FIG. 8 illustrates an example logic flow.

FIG. 8 illustrates an example logic flow 800. As shown in FIG. 8, logic flow 800 may include actions by a memory controller (e.g., memory controller 220) and either a DDR memory device (e.g. memory device 340) or an LPDDR5 memory device (e.g. memory device 240) during command bus (CA) training). In some examples, the memory controller trains an I/O interface between the memory controller and a memory device in response to a reset or initialization condition, 802. For these examples, the chip select (CS) signal line is trained separately from other signal lines of the command bus of the I/O interface, 804. According to some examples, the memory controller, based on memory type, sends a command or sequence of commands to the memory device to trigger entry into a command bus training mode, 806. In response to the trigger, a DDR5 memory device enters CA training mode (CATM), 808A or an LPDDR5 memory device enters a command bus training (CBT) mode, 808B.

In some examples, while the memory device is in a CA training mode, the memory controller drives a CA pattern on the command bus, 810. In some examples, the memory device samples the CA pattern, 812A/B. If the memory device is the DDR5 memory device, XOR circuitry at the DDR5 memory may XOR the sampled CA pattern, 812A and then output a parity value on a data bus to represent a compressed sampled CA pattern, 816A. If the memory device is the LPDDR5 memory device, the full sampled CA pattern is output on the data bus, 816B.

According to some examples, the memory controller reads the data bus, 818. In one example, if what is read from the data bus is a CA sampled pattern, 820 pat. branch, the memory controller utilizes error detecting circuitry to compress the CA sampled pattern, 822 (e.g., to an XOR parity value, a CRC value or a signature value). The memory device evaluates the compressed value for an indication that the CA pattern was sampled correctly, 824. In some examples, if the memory controller determines the CA pattern was not sampled correctly, 826 No branch, the memory controller may cause the memory device to change at least one I/O interface parameter and repeats driving the CA pattern on the CA bus, 810.

According to some examples, if the command bus (CB) is trained, 826 Yes branch, the memory controller triggers an exit from command bus training, 828. In response to triggering the exit of command bus training, the DDR5 memory device exits CATM and sets its parameters for the trained command bus, 830A or the LPDDR5 memory device exits CBT mode and sets its parameters for the trained command bus, 830B. In some examples, after training the command bus, the memory controller may separately train the data bus for data patterns written to the memory device, 832.

Figure 9:
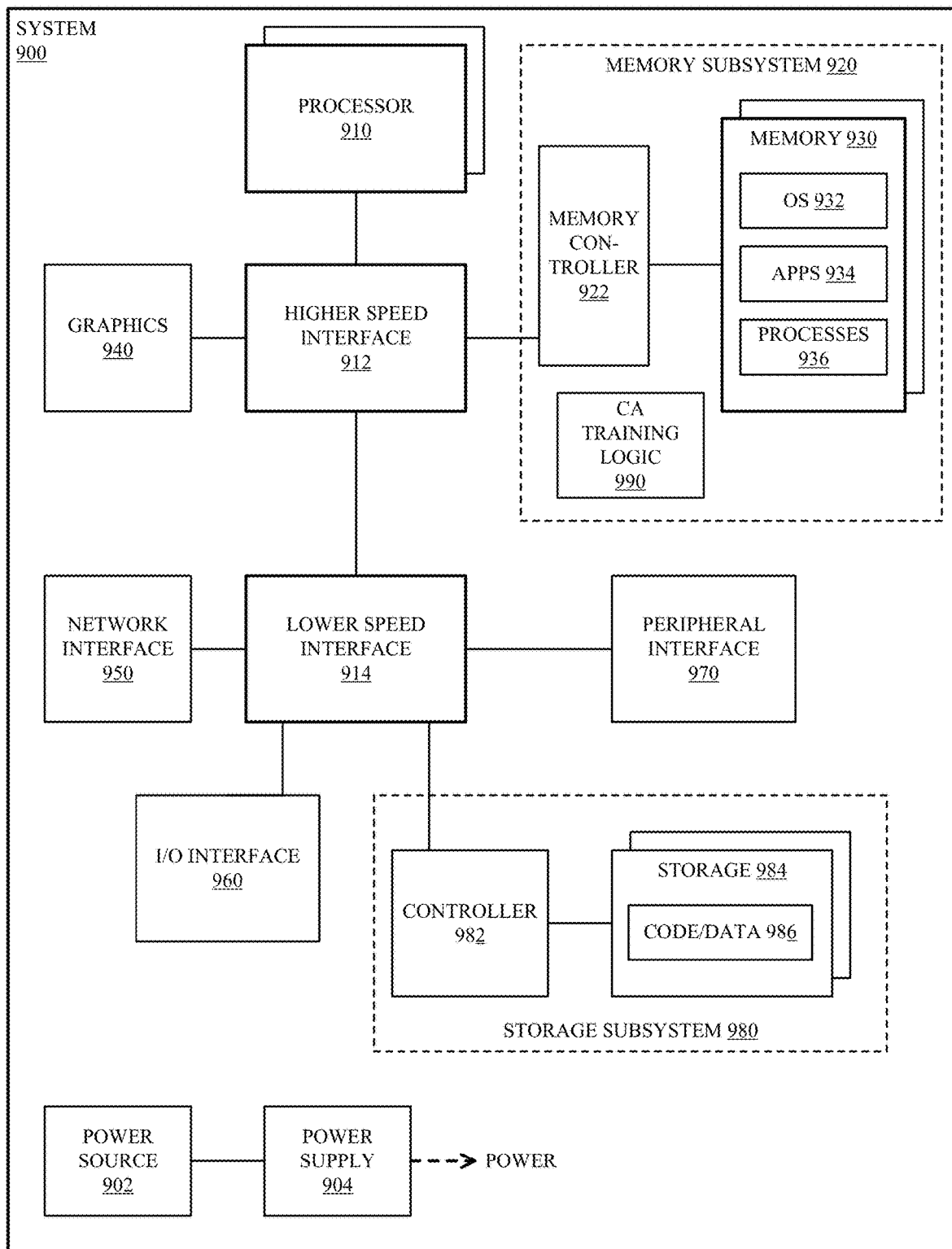
FIG. 9 illustrates an example fourth system.

FIG. 9 illustrates an example system 900. In some examples, system 900 may be a computing system in which a memory system may implement a CA training mode. System 900 represents a computing device in accordance with any example described herein, and can be a laptop computer, a desktop computer, a tablet computer, a server, a gaming or entertainment control system, a scanner, copier, printer, routing or switching device, embedded computing device, a smartphone, a wearable device, an internet-of-things device or other electronic device.

System 900 includes processor 910, which provides processing, operation management, and execution of instructions for system 900. Processor 910 can include any type of microprocessor, central processing unit (CPU), graphics processing unit (GPU), processing core, or other processing hardware to provide processing for system 900, or a combination of processors. Processor 910 controls the overall operation of system 900, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 900 includes interface 912 coupled to processor 910, which can represent a higher speed interface or a high throughput interface for system components that needs higher bandwidth connections, such as memory subsystem 920 or graphics interface components 940. Interface 912 represents an interface circuit, which can be a standalone component or integrated onto a processor die. Where present, graphics interface 940 interfaces to graphics components for providing a visual display to a user of system 900. In one example, graphics interface 940 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 940 generates a display based on data stored in memory 930 or based on operations executed by processor 910 or both.

Memory subsystem 920 represents the main memory of system 900 and provides storage for code to be executed by processor 910, or data values to be used in executing a routine. Memory 930 of memory subsystem 920 may include one or more memory devices such as read-only memory (ROM), flash memory, one or more varieties of random access memory (RAM) such as DRAM, or other memory devices, or a combination of such devices. Memory 930 stores and hosts, among other things, operating system (OS) 932 to provide a software platform for execution of instructions in system 900. Additionally, applications 934 can execute on the software platform of OS 932 from memory 930. Applications 934 represent programs that have their own operational logic to perform execution of one or more functions. Processes 936 represent agents or routines that provide auxiliary functions to OS 932 or one or more applications 934 or a combination. OS 932, applications 934, and processes 936 provide software logic to provide functions for system 900. In one example, memory subsystem 920 includes memory controller 922, which is a memory controller to generate and issue commands to memory 930. It will be understood that memory controller 922 could be a physical part of processor 910 or a physical part of interface 912. For example, memory controller 922 can be an integrated memory controller, integrated onto a circuit with processor 910.

While not specifically illustrated, it will be understood that system 900 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus.

In one example, system 900 includes interface 914, which can be coupled to interface 912. Interface 914 can be a lower speed interface than interface 912. In one example, interface 914 represents an interface circuit, which can include standalone components and integrated circuitry. In one example, multiple user interface components or peripheral components, or both, couple to interface 914. Network interface 950 provides system 900 the ability to communicate with remote devices (e.g., servers or other computing devices) over one or more networks. Network interface 950 can include an Ethernet adapter, wireless interconnection components, cellular network interconnection components, USB (universal serial bus), or other wired or wireless standards-based or proprietary interfaces. Network interface 950 can exchange data with a remote device, which can include sending data stored in memory or receiving data to be stored in memory.

In one example, system 900 includes one or more input/output (I/O) interface(s) 960. I/O interface(s) 960 can include one or more interface components through which a user interacts with system 900 (e.g., audio, alphanumeric, tactile/touch, or other interfacing). Peripheral interface 970 can include any hardware interface not specifically mentioned above. Peripherals refer generally to devices that connect dependently to system 900. A dependent connection is one where system 900 provides the software platform or hardware platform or both on which operation executes, and with which a user interacts.

In one example, system 900 includes storage subsystem 980 to store data in a nonvolatile manner. In one example, in certain system implementations, at least certain components of storage subsystem 980 can overlap with components of memory subsystem 920. Storage subsystem 980 includes storage device(s) 984, which can be or include any conventional medium for storing large amounts of data in a nonvolatile manner, such as one or more magnetic, solid state, or optical based disks, or a combination. Storage device(s) 984 holds code or instructions and data 986 in a persistent state (i.e., the value is retained despite interruption of power to system 900). Storage device(s) 984 can be generically considered to be a "memory," although memory 930 is typically the executing or operating memory to provide instructions to processor 910. Whereas storage device(s) 984 is nonvolatile, memory 930 can include volatile memory (i.e., the value or state of the data is indeterminate if power is interrupted to system 900). In one example, storage subsystem 980 includes controller 982 to interface with storage device(s) 984. In one example controller 982 is a physical part of interface 914 or processor 910 or can include circuits or logic in both processor 910 and interface 914.

Power source 902 provides power to the components of system 900. More specifically, power source 902 typically interfaces to one or multiple power supplies 904 in system 900 to provide power to the components of system 900. In one example, power supply 904 includes an AC to DC (alternating current to direct current) adapter to plug into a wall outlet. Such AC power can be renewable energy (e.g., solar power) power source 902. In one example, power source 902 includes a DC power source, such as an external AC to DC converter. In one example, power source 902 or power supply 904 includes wireless charging hardware to charge via proximity to a charging field. In one example, power source 902 can include an internal battery or fuel cell source.

In one example, memory subsystem 920 includes CA training logic 990. CA training logic 990 may include logic at memory controller 922 to trigger a CA or command bus training mode and send signals to train a CA signal line. Memory 930 may include logic to provide feedback in response to CA patterns driven on the CA signal line. In CA training mode, memory 930 may indicate a compressed sampled value or the full CA pattern sampled in response to a given CA pattern driven on the CA signal line. The CA training may be in accordance with any example described herein.

Figure 10:
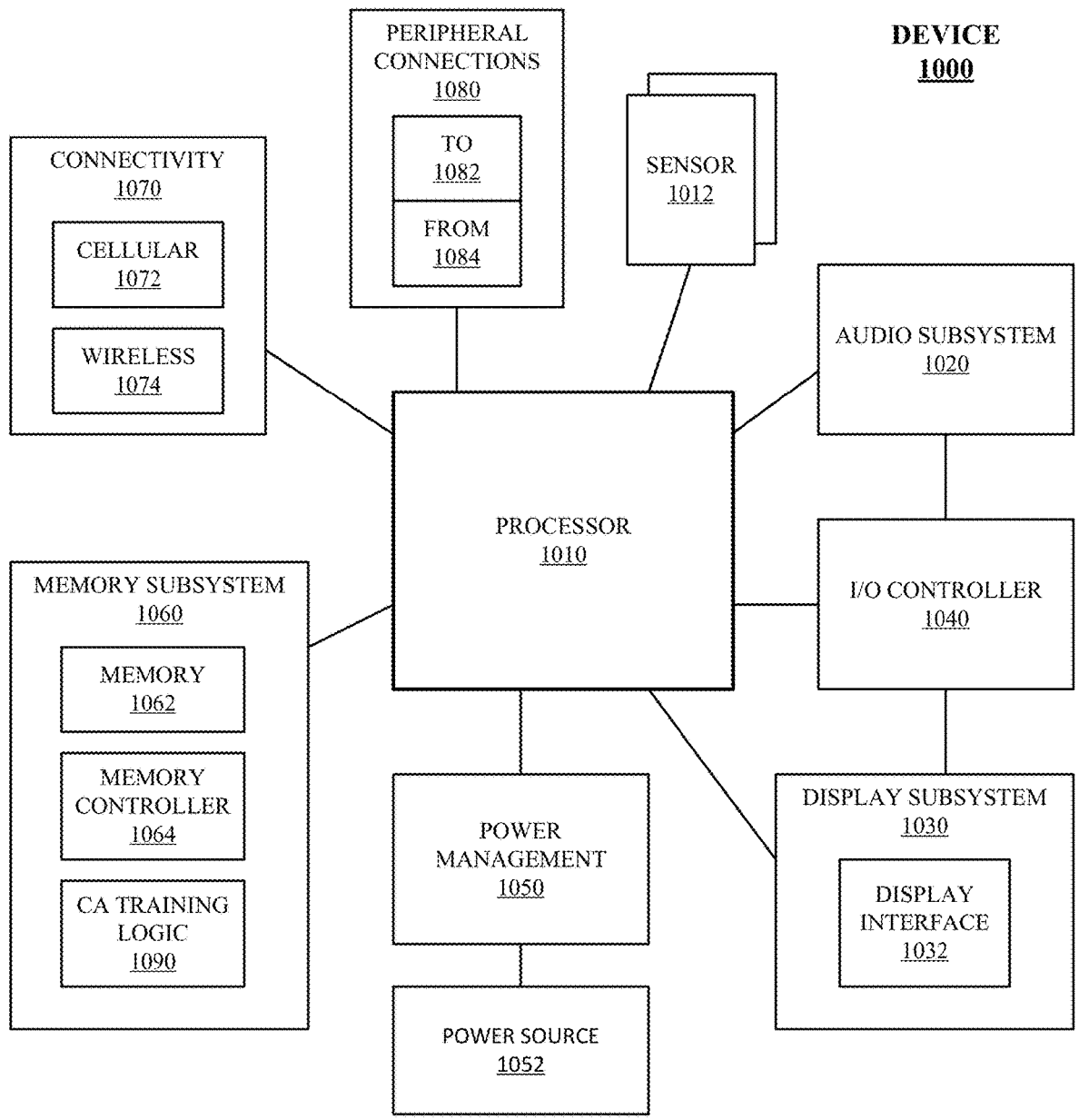
FIG. 10 illustrates an example device.

FIG. 10 illustrates an example device 1000. In some examples, device 1000 may be a mobile device in which a memory system may implement a CA training mode. Device 1000 represents a mobile computing device, such as a computing tablet, a mobile phone or smartphone, a wireless-enabled e-reader, wearable computing device, an internet-of-things device or other mobile device, or an embedded computing device. It will be understood that certain of the components are shown generally, and not all components of such a device are shown in device 1000.

Device 1000 includes processor 1010, which performs the primary processing operations of device 1000. Processor 1010 can include one or more physical devices, such as microprocessors, application processors, microcontrollers, programmable logic devices, or other processing means. The processing operations performed by processor 1010 include the execution of an operating platform or operating system on which applications and device functions are executed. The processing operations include operations related to I/O (input/output) with a human user or with other devices, operations related to power management, operations related to connecting device 1000 to another device, or a combination. The processing operations can also include operations related to audio I/O, display I/O, or other interfacing, or a combination. Processor 1010 can execute data stored in memory. Processor 1010 can write or edit data stored in memory.

In one example, device 1000 includes one or more sensors 1012. Sensors 1012 represent embedded sensors or interfaces to external sensors, or a combination. Sensors 1012 enable device 1000 to monitor or detect one or more conditions of an environment or a device in which device 1000 is implemented. Sensors 1012 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 1012 can also include sensors for biometric systems such as fingerprint recognition systems, face detection or recognition systems, or other systems that detect or recognize user features. Sensors 1012 should be understood broadly, and not limiting on the many different types of sensors that could be implemented with device 10000. In one example, one or more sensors 1012 couples to processor 1010 via a frontend circuit integrated with processor 1010. In one example, one or more sensors 1012 couples to processor 1010 via another component of device 10000.

In one example, device 1000 includes audio subsystem 1020, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into device 1000 or connected to device 1000. In one example, a user interacts with device 1000 by providing audio commands that are received and processed by processor 1010.

Display subsystem 1030 represents hardware (e.g., display devices) and software components (e.g., drivers) that provide a visual display for presentation to a user. In one example, the display includes tactile components or touchscreen elements for a user to interact with the computing device. Display subsystem 1030 includes display interface 1032, which includes the particular screen or hardware device used to provide a display to a user. In one example, display interface 1032 includes logic separate from processor 1010 (such as a graphics processor) to perform at least some processing related to the display. In one example, display subsystem 1030 includes a touchscreen device that provides both output and input to a user. In one example, display subsystem 1030 includes a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, display subsystem includes a touchscreen display. In one example, display subsystem 1030 generates display information based on data stored in memory or based on operations executed by processor 1010 or both.

I/O controller 1040 represents hardware devices and software components related to interaction with a user. I/O controller 1040 can operate to manage hardware that is part of audio subsystem 1020, or display subsystem 1030, or both. Additionally, I/O controller 1040 illustrates a connection point for additional devices that connect to device 1000 through which a user might interact with the system. For example, devices that can be attached to device 1000 might include microphone devices, speaker or stereo systems, video systems or other display device, keyboard or keypad devices, or other I/O devices for use with specific applications such as card readers or other devices.

As mentioned above, I/O controller 1040 can interact with audio subsystem 1020 or display subsystem 1030 or both. For example, input through a microphone or other audio device can provide input or commands for one or more applications or functions of device 1000. Additionally, audio output can be provided instead of or in addition to display output. In another example, if display subsystem includes a touchscreen, the display device also acts as an input device, which can be at least partially managed by I/O controller 1040. There can also be additional buttons or switches on device 1000 to provide I/O functions managed by I/O controller 1040.

In one example, I/O controller 1040 manages devices such as accelerometers, cameras, light sensors or other environmental sensors, gyroscopes, global positioning system (GPS), or other hardware that can be included in device 1000, or sensors 1012. The input can be part of direct user interaction, as well as providing environmental input to the system to influence its operations (such as filtering for noise, adjusting displays for brightness detection, applying a flash for a camera, or other features).

In one example, device 1000 includes power management 1050 that manages battery power usage, charging of the battery, and features related to power saving operation. Power management 1050 manages power from power source 1052, which provides power to the components of device 10000. In one example, power source 1052 includes an AC to DC (alternating current to direct current) adapter to plug into a wall outlet. Such AC power can be renewable energy (e.g., solar power, motion based power). In one example, power source 1052 includes only DC power, which can be provided by a DC power source, such as an external AC to DC converter. In one example, power source 1052 includes wireless charging hardware to charge via proximity to a charging field. In one example, power source 1052 can include an internal battery or fuel cell source.

Memory subsystem 1060 includes memory device(s) 1062 for storing information in device 1000. Memory subsystem 1060 can include nonvolatile (state does not change if power to the memory device is interrupted) or volatile (state is indeterminate if power to the memory device is interrupted) memory devices, or a combination. Memory subsystem 1060 can store application data, user data, music, photos, documents, or other data, as well as system data (whether long-term or temporary) related to the execution of the applications and functions of device 10000. In one example, memory subsystem 1060 includes memory controller 1064 (which could also be considered part of the control of device 10000 and could potentially be considered part of processor 1010). Memory controller 1064 includes a scheduler to generate and issue commands to control access to memory device(s) 1062.

Connectivity 1070 includes hardware devices (e.g., wireless or wired connectors and communication hardware, or a combination of wired and wireless hardware) and software components (e.g., drivers, protocol stacks) to enable device 1000 to communicate with external devices. The external device could be separate devices, such as other computing devices, wireless access points or base stations, as well as peripherals such as headsets, printers, or other devices. In one example, device 10000 exchanges data with an external device for storage in memory or for display on a display device. The exchanged data can include data to be stored in memory, or data already stored in memory, to read, write, or edit data.

Connectivity 1070 can include multiple different types of connectivity. To generalize, device 1000 is illustrated with cellular connectivity 1072 and wireless connectivity 1074. Cellular connectivity 1072 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 1074 refers to wireless connectivity that is not cellular and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 1080 include hardware interfaces and connectors, as well as software components (e.g., drivers, protocol stacks) to make peripheral connections. It will be understood that device 1000 could both be a peripheral device ("to" 1082) to other computing devices, as well as have peripheral devices ("from" 1084) connected to it. Device 1000 commonly has a "docking" connector to connect to other computing devices for purposes such as managing (e.g., downloading, uploading, changing, synchronizing) content on device 1000. Additionally, a docking connector can allow device 1000 to connect to certain peripherals that allow device 1000 to control content output, for example, to audiovisual or other systems.

In addition to a proprietary docking connector or other proprietary connection hardware, device 1000 can make peripheral connections 1080 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one example, memory subsystem 1060 includes CA training logic 1090. CA training logic 1090 may include logic at memory controller 1064 to trigger a CA or command bus training mode and send signals to train a CA signal line. Memory 1162 may include logic provide feedback in response to CA patterns driven on the CA signal line. In the CA training mode, memory 1162 may indicate a compressed sampled value or the full CA pattern sampled in response to a given CA pattern driven on the CA signal line. The CA training mode may be in accordance with any example described herein.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" and may be similar to IP blocks. IP cores may be stored on a tangible, machine readable medium and supplied to various customers or manufacturing facilities to load into the fabrication machines that actually make the logic or processor.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may include an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled" or "coupled with", however, may also mean that two or more elements are not in direct contact with each other, but yet still co-operate or interact with each other.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

The follow examples pertain to additional examples of technologies disclosed herein.

Example 1. An example memory controller may include a command logic to generate a first command to trigger a memory device to enter one of a first command bus training mode or a second command bus training mode to train a CA interface of the memory device. The memory controller may also include I/O training circuitry to cause a CA pattern to be output via a command bus coupled with the CA interface of the memory device. The I/O training circuitry may also compress a sampled CA pattern received from the memory device via a data bus coupled with a DQ interface of the memory device to generate a first compressed value based on the memory device being in the first command bus training mode and forward the first compressed value to the command logic. Alternatively, the I/O training circuitry may forward a second compressed value received from the memory device via the data bus. The second compressed value may represent the sampled CA pattern compressed at the memory device based on the memory device being in the second command bus training mode.

Example 2. The memory controller of example 1 may also include the command logic to use the first compressed value or the second compressed value to determine whether the CA pattern sent via the command bus matches the sampled CA pattern. The command logic may also cause an adjustment to one or more electrical or timing parameters associated with the CA interface of the memory device if the CA pattern sent does not match the sampled CA pattern.

Example 3. The memory controller of example 1 may also include the I/O training circuitry to generate the CA pattern to be output via an even number of signal lines included in the command bus. The first compressed value or the second compressed value are an even parity value of 0 based on the CA pattern, sent via the even number of signal lines, matching the sampled CA pattern.

Example 4. The memory controller of example 3, the second command bus training mode is CATM and the memory device is an SDRAM device compatible with a double data rate standard. The SDRAM device may have circuitry to generate the even parity value of 0 from the sampled CA pattern and indicate the even parity value of 0 for the sampled CA pattern via the data bus.

Example 5. The memory controller of example 3, the first command bus training mode is a CBT mode, the memory device may be an SDRAM device compatible with a double data rate standard. The I/O training circuitry may include one or more XOR gates to generate the even parity value of 0 from the sampled CA pattern received from the SDRAM device.

Example 6. The memory controller of example 1, the first command bus training mode is a CBT mode. The memory device may be an SDRAM device compatible with a double data rate standard. The I/O training circuitry may include circuitry to calculate a CRC value from the sampled CA pattern received from the SDRAM device to generate the first compressed value and forward the CRC value to the command logic. The command logic may use the CRC value to determine whether the CA pattern sent via the command bus matches the sampled CA pattern, and cause an adjustment to one or more electrical or timing parameters associated with the CA interface of the memory device if the CA pattern is determined to not match the sample CA pattern.

Example 7. The memory controller of example 1, the first command bus training mode is a CBT mode. The memory device may be an SDRAM device compatible with a double data rate standard. The I/O training circuitry may include a multi-input shift register to generate a signature value from the sampled CA pattern received from the SDRAM device to generate the first compressed value and forward the signature value to the command logic. The command logic may use the signature value to determine whether the CA pattern sent via the command bus matches the sampled CA pattern and cause an adjustment to one or more electrical or timing parameters associated with the CA interface of the memory device if the CA pattern is determined to not match the sample CA pattern.

Example 8. The memory controller of example 1, the CA pattern to be output via the command bus may include the CA pattern generated based on a same CA training algorithm that is capable of being implemented for the first command bus training mode and the second command bus training mode.

Example 9. An example system may include a memory device having a CA interface and a DQ interface. The system may also include a command bus coupled with the CA interface, a data bus coupled with the DQ interface and a memory controller coupled to the command bus and the data bus. The memory controller may include a command logic to generate a first command to trigger the memory device to enter one of a first command bus training mode or a second command bus training mode to train the CA interface. The memory controller may also include I/O training circuitry to cause a CA pattern to be output via the command bus. The I/O training circuitry may also compress a sampled CA pattern received from the memory device via the data bus to generate a first compressed value based on the memory device being in the first command bus training mode and forward the first compressed value to the command logic. Alternatively, the I/O training circuitry may forward a second compressed value received from the memory device via the data bus. The second compressed value may represent the sampled CA pattern compressed at the memory device based on the memory device being in the second command bus training mode.

Example 10. The system of example 9, the command logic to use the first compressed value or the second compressed value to determine whether the CA pattern sent via the command bus matches the sampled CA pattern. The command logic to also cause an adjustment to one or more electrical or timing parameters associated with the CA interface of the memory device if the CA pattern sent does not match the sampled CA pattern.

Example 11. The system of example 9, the I/O training circuitry to generate a CA pattern to be output via an even number of signal lines included in the command bus. The first compressed value or the second compressed value may be an even parity value of 0 based on the CA pattern, sent via the even number of signal lines, matching the sampled CA pattern.

Example 12. The system of example 11, the second command bus training mode may be CATM. The memory device may be an SDRAM device compatible with a double data rate standard. The SDRAM device may have circuitry to generate the even parity value of 0 from the sampled CA pattern and indicate the even parity value of 0 for the sampled CA pattern via the data bus.

Example 13. The system of example 11, the first command bus training mode may be a CBT mode. The memory device an SDRAM device compatible with a double data rate standard. The I/O training circuitry may include one or more exclusive XOR gates to generate the even parity value of 0 from the sampled CA pattern received from the SDRAM device.

Example 14. The system of example 9, the first command bus training mode may be a CBT mode. The memory device may be an SDRAM device compatible with a double data rate standard. The I/O training circuitry may include circuitry to calculate a CRC value from the sampled CA pattern received from the SDRAM device to generate the first compressed value and forward the CRC value to the command logic. The command logic may use the CRC value to determine whether the CA pattern sent via the command bus matches the sampled CA pattern and cause an adjustment to one or more electrical or timing parameters associated with the CA interface of the memory device if the CA pattern is determined to not match the sample CA pattern.

Example 15. The system of example 9, the first command bus training mode may be a CBT mode. The memory device may be an SDRAM device compatible with a double data rate standard. The I/O training circuitry may include a multi-input shift register to generate a signature value from the sampled CA pattern received from the SDRAM device to generate the first compressed value and forward the signature value to the command logic. The command logic may use the signature value to determine whether the CA pattern sent via the command bus matches the sampled CA pattern. The command logic may also cause an adjustment to one or more electrical or timing parameters associated with the CA interface of the memory device if the CA pattern is determined to not match the sample CA pattern.

Example 16. The system of example 9, the CA pattern to be output via the command bus may include the CA pattern generated based on a same CA training algorithm that is capable of being implemented for the first command bus training mode and the second command bus training mode.

Example 17. An example method may include generating, at a memory controller, a first command to trigger a memory device to enter one of a first command bus training mode or a second command bus training mode to train a CA interface of the memory device. The method may also include causing a CA pattern to be output via a command bus coupled with the CA interface of the memory device. For these examples, depending on whether the memory device was triggered to be in the first or the second command bus training mode, the method may include receiving a sampled CA pattern from the memory device via a data bus coupled with a DQ interface of the memory device based on the memory device being in the first command bus training mode and compress the received sampled CA pattern generate a first compressed value, or may include receiving a second compressed value received from the memory device via the data bus, the second compressed value representing the sampled CA pattern compressed at the memory device based on the memory device being in the second command bus training mode. The method may also include using the first compressed value or the second compressed value to determine whether the CA pattern sent via the command bus matches the sampled CA pattern. The method may also include causing an adjustment to one or more electrical or timing parameters associated with the CA interface of the memory device if the CA pattern sent does not match the sampled CA pattern.

Example 18. The method of example 17 may also include generating the CA pattern to be output via an even number of signal lines included in the command bus. The method may also include the first compressed value or the second compressed value are an odd parity value of 1 based on the CA pattern, sent via the even number of signal lines, not matching the sampled CA pattern.

Example 19. The method of example 18, the second command bus training mode is a CATM. The memory device may be an SDRAM device compatible with a double data rate standard. The SDRAM device may have circuitry to generate the odd parity value of 1 from the sampled CA pattern and indicate the odd parity value of 1 for the sampled CA pattern via the data bus.

Example 20. The method of example 18, the first command bus training mode may be a CBT mode. The memory device may be an SDRAM device compatible with a double data rate standard. The method may also include using one or more XOR gates at the memory controller to generate the odd parity value of 1 from the sampled CA pattern received from the SDRAM device.

Example 21. The method of example 17, the first command bus training mode is a CBT mode and the memory device is may be an SDRAM device compatible with a double data rate standard. The method may also include calculating a CRC value from the sampled CA pattern received from the SDRAM device to generate the first compressed value. The method may also include using the CRC value to determine whether the CA pattern sent via the command bus matches the sampled CA pattern.

Example 22. The method of example 17, the first command bus training mode may be a CBT mode and the memory device may be an SDRAM device compatible with a double data rate standard. The method may also include generating a signature value from the sampled CA pattern received from the SDRAM device to generate the first compressed value. The method may also include using the signature value to determine whether the CA pattern sent via the command bus matches the sampled CA pattern.

Example 23. The method of example 17, the CA pattern to be output via the command bus may include the CA pattern generated based on a same CA training algorithm that is capable of being implemented for the first command bus training mode and the second command bus training mode.

Example 24. An example at least one machine readable medium may include a plurality of instructions that in response to being executed by a system may cause the system to carry out a method according to any one of examples 17 to 23.

Example 25. An example apparatus may include means for performing the methods of any one of examples 17 to 23.

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single example for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus, the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus comprising:
   a controller logic configured to generate a first command to trigger a memory device to enter one of a first command bus training mode or a second command bus training mode to train a command and address (CA) interface of the memory device; and
   input/output (I/O) circuitry configured to:
      cause a CA pattern to be output via a command bus coupled with the CA interface of the memory device; and
      receive a sampled CA pattern from the memory device via a data bus coupled with a DQ interface of the memory device, compress the sampled CA pattern to generate a first compressed value based on the memory device being in the first command bus training mode and forward the first compressed value to the controller logic; or
      receive a second compressed value from the memory device via the data bus, the second compressed value to represent the sampled CA pattern compressed at the memory device based on the memory device being in the second command bus training mode and forward the second compressed value to the controller logic.

2. The apparatus of claim 1, further comprising:
   the controller logic to use the first compressed value or the second compressed value to determine whether the CA pattern output via the command bus matches the sampled CA pattern; and
   cause an adjustment to one or more electrical or timing parameters associated with the CA interface of the memory device if the CA pattern output via the command bus does not match the sampled CA pattern.

3. The apparatus of claim 1, comprising:
   the I/O circuitry configured to cause the CA pattern to be output via an even number of signal lines included in the command bus; and
   the first compressed value or the second compressed value are an even parity value of 0 based on the CA pattern, output via the even number of signal lines, matching the sampled CA pattern.

4. The apparatus of claim 3, comprising:
   the second command bus training mode is a command address training mode (CATM); and
   the memory device is a synchronous dynamic random access memory (SDRAM) device compatible with a double data rate standard, the SDRAM device to have circuitry to generate the even parity value of 0 from the sampled CA pattern and indicate the even parity value of 0 for the sampled CA pattern via the data bus to provide the second compressed value to the I/O circuitry.

5. The apparatus of claim 3, comprising:
the first command bus training mode is a command bus training (CBT) mode;
the memory device is a synchronous dynamic random access memory (SDRAM) device compatible with a double data rate standard; and
the I/O circuitry, to generate the first compressed value, is configured to include one or more exclusive OR (XOR) gates to generate the even parity value of 0 from the sampled CA pattern received from the SDRAM device.

6. The apparatus of claim 1, comprising:
the first command bus training mode is a command bus training (CBT) mode;
the memory device is a synchronous dynamic random access memory (SDRAM) device compatible with a double data rate standard;
the I/O circuitry configured to include circuitry to calculate a cyclic redundancy check (CRC) value from the sampled CA pattern received from the SDRAM device to generate the first compressed value and forward the CRC value to the controller logic; and
the controller logic configured to:
use the CRC value to determine whether the CA pattern output via the command bus matches the sampled CA pattern, and
cause an adjustment to one or more electrical or timing parameters associated with the CA interface of the memory device if the CA pattern is determined to not match the sample CA pattern.

7. The apparatus of claim 1, comprising:
the first command bus training mode is a command bus training (CBT) mode;
the memory device is a synchronous dynamic random access memory (SDRAM) device compatible with a double data rate standard;
the I/O circuitry configured to include a multi-input shift register to generate a signature value from the sampled CA pattern received from the SDRAM device to generate the first compressed value and forward the signature value to the controller logic; and
the controller logic configured to:
use the signature value to determine whether the CA pattern output via the command bus matches the sampled CA pattern, and
cause an adjustment to one or more electrical or timing parameters associated with the CA interface of the memory device if the CA pattern is determined to not match the sample CA pattern.

8. The apparatus of claim 1, the CA pattern to be output via the command bus comprises the CA pattern generated based on a same CA training algorithm that is capable of being implemented for the first command bus training mode and the second command bus training mode.

9. A system comprising:
a memory device configured to include a command and address (CA) interface and a DQ interface;
a command bus configured to couple with the CA interface;
a data bus configured to couple with the DQ interface; and
a memory controller configured to couple with the command bus and the data bus, the memory controller to include:
a controller logic configured to generate a first command to trigger the memory device to enter one of a first command bus training mode or a second command bus training mode to train the CA interface; and
input/output (I/O) circuitry configured to:
cause a CA pattern to be output via the command bus; and
receive a sampled CA pattern from the memory device via the data bus, compress the sampled CA pattern to generate a first compressed value based on the memory device being in the first command bus training mode and forward the first compressed value to the controller logic; or
forward a second compressed value received from the memory device via the data bus, the second compressed value to represent the sampled CA pattern compressed at the memory device based on the memory device being in the second command bus training mode.

10. The system of claim 9, further comprising:
the controller logic to use the first compressed value or the second compressed value to determine whether the CA pattern output via the command bus matches the sampled CA pattern; and
cause an adjustment to one or more electrical or timing parameters associated with the CA interface of the memory device if the CA pattern output via the command bus does not match the sampled CA pattern.

11. The system of claim 9, comprising:
the I/O circuitry configured to generate the CA pattern to be output via an even number of signal lines included in the command bus; and
the first compressed value or the second compressed value are an even parity value of 0 based on the CA pattern, output via the even number of signal lines, matching the sampled CA pattern.

12. The system of claim 11, comprising:
the second command bus training mode is a command address training mode (CATM); and
the memory device is a synchronous dynamic random access memory (SDRAM) device compatible with a double data rate standard, the SDRAM device to have circuitry to generate the even parity value of 0 from the sampled CA pattern and indicate the even parity value of 0 for the sampled CA pattern via the data bus to provide the second compressed value to the I/O circuitry.

13. The system of claim 11, comprising:
the first command bus training mode is a command bus training (CBT) mode;
the memory device is a synchronous dynamic random access memory (SDRAM) device compatible with a double data rate standard; and
the I/O circuitry, to generate the first compressed value, is configured to include one or more exclusive OR (XOR) gates to generate the even parity value of 0 from the sampled CA pattern received from the SDRAM device.

14. The system of claim 9, comprising:
the first command bus training mode is a command bus training (CBT) mode;
the memory device is a synchronous dynamic random access memory (SDRAM) device compatible with a double data rate standard;
the I/O circuitry configured to include circuitry to calculate a cyclic redundancy check (CRC) value from the sampled CA pattern received from the SDRAM device to generate the first compressed value and forward the CRC value to the controller logic; and the controller logic configured to:
  use the CRC value to determine whether the CA pattern output via the command bus matches the sampled CA pattern, and
  cause an adjustment to one or more electrical or timing parameters associated with the CA interface of the memory device if the CA pattern is determined to not match the sample CA pattern.

15. The system of claim 9, comprising:
the first command bus training mode is a command bus training (CBT) mode;
the memory device is a synchronous dynamic random access memory (SDRAM) device compatible with a double data rate standard;
the I/O circuitry configured to include a multi-input shift register to generate a signature value from the sampled CA pattern received from the SDRAM device to generate the first compressed value and forward the signature value to the controller logic; and
the controller logic configured to:
  use the signature value to determine whether the CA pattern output via the command bus matches the sampled CA pattern, and
  cause an adjustment to one or more electrical or timing parameters associated with the CA interface of the memory device if the CA pattern is determined to not match the sample CA pattern.

16. A method comprising:
generating a first command to trigger a memory device to enter one of a first command bus training mode or a second command bus training mode to train a command and address (CA) interface of the memory device;
causing a CA pattern to be output via a command bus coupled with the CA interface of the memory device, wherein depending on whether the memory device was triggered to be in the first or the second command bus training mode:
  receiving a sampled CA pattern from the memory device via a data bus coupled with a DQ interface of the memory device, compressing the received sampled CA pattern to generate a first compressed value based on the memory device being in the first command bus training mode and forwarding the first compressed value to controller logic of a memory controller; or
  receiving a second compressed value from the memory device via the data bus, the second compressed value representing the sampled CA pattern compressed at the memory device based on the memory device being in the second command bus training mode and forwarding the second compressed value to the controller logic;
and
using the first compressed value or the second compressed value to determine whether the CA pattern output via the command bus matches the sampled CA pattern; and
causing an adjustment to one or more electrical or timing parameters associated with the CA interface of the memory device if the CA pattern output does not match the sampled CA pattern.

17. The method of claim 16, comprising:
generating the CA pattern to be output via an even number of signal lines included in the command bus; and
the first compressed value or the second compressed value are an odd parity value of 1 based on the CA pattern, output via the even number of signal lines, not matching the sampled CA pattern.

18. The method of claim 17, comprising:
the second command bus training mode is a command address training mode (CATM); and
the memory device is a synchronous dynamic random access memory (SDRAM) device compatible with a double data rate standard, the SDRAM device having circuitry to generate the odd parity value of 1 from the sampled CA pattern and indicate the odd parity value of 1 for the sampled CA pattern via the data bus to provide the second compressed value.

19. The method of claim 17, comprising:
the first command bus training mode is a command bus training (CBT) mode;
the memory device is a synchronous dynamic random access memory (SDRAM) device compatible with a double data rate standard; and
using one or more exclusive OR (XOR) gates at the memory controller to generate the odd parity value of 1 from the sampled CA pattern received from the SDRAM device.

20. The method of claim 16, the first command bus training mode is a command bus training (CBT) mode and the memory device is a synchronous dynamic random access memory (SDRAM) device compatible with a double data rate standard, the method further comprising:
calculating a cyclic redundancy check (CRC) value from the sampled CA pattern received from the SDRAM device to generate the first compressed value; and
using the CRC value to determine whether the CA pattern output via the command bus matches the sampled CA pattern.

* * * * *